(12) United States Patent
Shi et al.

(10) Patent No.: US 12,507,528 B2
(45) Date of Patent: Dec. 23, 2025

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Shi, Beijing (CN); Chi Yu, Beijing (CN); Weiyun Huang, Beijing (CN); Yue Long, Beijing (CN); Jianchang Cai, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 651 days.

(21) Appl. No.: 17/781,531

(22) PCT Filed: May 25, 2021

(86) PCT No.: PCT/CN2021/095740
§ 371 (c)(1),
(2) Date: Jun. 1, 2022

(87) PCT Pub. No.: WO2022/246640
PCT Pub. Date: Dec. 1, 2022

(65) Prior Publication Data
US 2024/0215343 A1    Jun. 27, 2024

(51) Int. Cl.
*H10K 59/131* (2023.01)
*H10K 59/12* (2023.01)
(Continued)

(52) U.S. Cl.
CPC ..... *H10K 59/1213* (2023.02); *H10K 59/1201* (2023.02); *H10K 59/124* (2023.02);
(Continued)

(58) Field of Classification Search
CPC .... H10K 71/60; H10K 59/131; H10K 59/124; H10K 59/00; H10K 59/126; H10K 59/8792; H10K 50/86; H10K 59/65
See application file for complete search history.

(56) References Cited

U.S. PATENT DOCUMENTS 10,396,104 B2    8/2019  Gu
2020/0052048 A1*  2/2020  Kuo ............... H10K 59/123
(Continued)

FOREIGN PATENT DOCUMENTS

CN    107154406 A    9/2017
CN    108922867 A    11/2018
(Continued)

OTHER PUBLICATIONS

Machine translation, Wang, Chinese Pat. Pub. No. CN-111146267-A, translation date: Aug. 6, 2025, Clarivate Analytics, all pages. (Year: 2025).*

*Primary Examiner* — Victoria K. Hall
(74) *Attorney, Agent, or Firm* — Scully, Scott, Murphy & Presser, P.C.

(57) ABSTRACT

A display substrate, a manufacturing method thereof and a display device are provided. The display substrate includes: a base substrate; a first conductive element located on the base substrate; a first planarization layer located on the first conductive element; a second conductive element located on the first planarization layer and connected to the first conductive element through a first via hole penetrating through the first planarization layer; a second planarization layer located on the second conductive element; and a conductive (Continued)

line located on the second planarization layer; the second conductive element is recessed at the first via hole, the second planarization layer has a light-shielding portion, and an orthographic projection of the first via hole on the base substrate falls within an orthographic projection of the light-shielding portion on the base substrate.

20 Claims, 16 Drawing Sheets

(51) Int. Cl.
| | |
|---|---|
| H10K 59/121 | (2023.01) |
| H10K 59/124 | (2023.01) |
| H10K 59/126 | (2023.01) |
| H10K 59/50 | (2023.01) |
| H10K 59/65 | (2023.01) |
| H10K 59/80 | (2023.01) |
| H10K 71/60 | (2023.01) |

(52) U.S. Cl.
CPC ......... *H10K 59/126* (2023.02); *H10K 59/131* (2023.02); *H10K 59/50* (2023.02); *H10K 59/65* (2023.02); *H10K 59/8792* (2023.02); *H10K 71/60* (2023.02); *H10K 59/805* (2023.02)

(56) References Cited

U.S. PATENT DOCUMENTS

2021/0028252 A1\* 1/2021 Hong .................. H10K 77/111
2021/0351384 A1\* 11/2021 Lee ..................... H10K 59/124

FOREIGN PATENT DOCUMENTS

| CN | 111146267 A | \* | 5/2020 | ........... H10K 59/126 |
| CN | 112259591 A | | 1/2021 | |
| KR | 20080051220 A | | 6/2008 | |

\* cited by examiner

DISPLAY SUBSTRATE AND MANUFACTURING METHOD THEREOF, AND DISPLAY DEVICE

CROSS-REFERENCE TO RELATED APPLICATIONS

This application is a national phase entry of PCT International Application No. PCT/CN2021/095740, filed on May 25, 2021. The disclosure of PCT International Application No. PCT/CN2021/095740 is incorporated by reference herein.

TECHNICAL FIELD

At least one embodiment of the present disclosure relates to a display substrate and a manufacturing method thereof, and a display device.

BACKGROUND

With the continuous development of display technology, active-matrix organic light-emitting diode (AMOLED) display technology has been more and more widely used in mobile phones, tablet computers, digital cameras and other display devices for its advantages such as self-luminescence, wide viewing angle, high contrast, low power consumption, and high response speed, and the like.

Under-screen camera technology is a brand-new technology proposed to increase the screen-to-body ratio of a display device.

SUMMARY

At least one embodiment of the present disclosure relates to a display substrate and a manufacturing method thereof, and a display device.

At least one embodiment of the present disclosure provides a display substrate, including a base substrate; a first conductive element, located on the base substrate; a first planarization layer, located on the first conductive element; a second conductive element, located on the first planarization layer and connected to the first conductive element through a first via hole penetrating through the first planarization layer; a second planarization layer, located on the second conductive element; and a conductive line, located on the second planarization layer; the second conductive element is recessed at the first via hole, the second planarization layer has a light-shielding portion, and an orthographic projection of the first via hole on the base substrate falls within an orthographic projection of the light-shielding portion on the base substrate.

For example, the second planarization layer further has a light-transmitting portion, and the orthographic projection of the first via hole on the base substrate has no overlap with an orthographic projection of the light-transmitting portion on the base substrate.

For example, the orthographic projection of the light-shielding portion on the base substrate overlaps with an orthographic projection of the second conductive element on the base substrate.

For example, the orthographic projection of the light-shielding portion on the base substrate coincides with an orthographic projection of the second conductive element on the base substrate.

For example, the second conductive element has a recessed portion and a peripheral portion at an outer side of the recessed portion, the recessed portion has a bottom portion and a side portion, and the bottom portion is connected to the peripheral portion through the side portion.

For example, the second planarization layer includes a photochromic material.

For example, the photochromic material is doped, as a doping material, in a base material of forming the second planarization layer.

For example, the photochromic material includes a material which is black in itself and turns transparent after light irradiation.

For example, the material that is black in itself and turns transparent after light irradiation includes heterocyclic nitrogen oxides or azo dyes.

For example, the photochromic material includes a material which is transparent in itself and turns black after light irradiation.

For example, the material that is transparent in itself and turns black after light irradiation includes silver halide.

For example, the photochromic material includes a material which is black in itself and turns transparent after light irradiation, and an orthographic projection of the second conductive element on the base substrate falls within the orthographic projection of the light-shielding portion on the base substrate.

For example, the photochromic material includes a material which is transparent in itself and turns black after light irradiation, and the orthographic projection of the first via hole on the base substrate coincides with the orthographic projection of the light-shielding portion on the base substrate.

For example, the display substrate further includes a pixel unit, the pixel unit includes a pixel circuit and a light-emitting element, the pixel circuit is configured to drive the light-emitting element, the pixel unit includes a first pixel unit and a second pixel unit, the display substrate includes a first display region and a second display region, the pixel circuit and the light-emitting element of the first pixel unit are both located in the first display region, the pixel circuit of the second pixel unit is located in the first display region, the light-emitting element of the second pixel unit is located in the second display region, and the pixel circuit of the second pixel unit is connected to the light-emitting element of the second pixel unit through the conductive line.

For example, the second display region is a light-transmitting display region.

For example, an orthographic projection of the pixel circuit of the first pixel unit on the base substrate at least partially overlaps with an orthographic projection of the light-emitting element of the first pixel unit on the base substrate, and an orthographic projection of the pixel circuit of the second pixel unit on the base substrate has no overlap with an orthographic projection of the light-emitting element of the second pixel unit.

For example, an orthographic projection of the conductive line on the base substrate partially overlaps with an orthographic projection of the pixel circuit of the first pixel unit on the base substrate.

For example, the display substrate further includes a connection element, the connection element includes a first connection element and a second connection element, the pixel circuit of the first pixel unit is connected to the light-emitting element of the first pixel unit through the first connection element, and the pixel circuit of the second pixel unit is connected to the conductive line through the second connection element.

For example, the connection element includes a first connection electrode and a second connection electrode, the first connection electrode is connected to the second connection electrode, the first conductive element includes the first connection electrode, and the second conductive element includes the second connection electrode connected to the first connection electrode.

For example, the first conductive element and the first connection electrode are located in a same layer, and the second conductive element and the second connection electrode are located in a same layer.

For example, the pixel circuit includes a driving transistor, and the driving transistor includes a gate electrode; the display substrate further includes: a first gate signal line, connected to the gate electrode of the driving transistor; a constant voltage line, configured to provide a first constant voltage to the pixel circuit; and a shield electrode, connected to the constant voltage line, wherein an orthographic projection of the first gate signal line on the base substrate falls within an orthographic projection of the shield electrode on the base substrate.

For example, the first conductive element includes the constant voltage line, and the second conductive element includes the shield electrode connected to the constant voltage line.

For example, the first conductive element and the constant voltage line are located in a same layer, and the second conductive element and the shield electrode are located in a same layer.

For example, the second conductive element is connected to the conductive line or the light-emitting element of the first pixel unit through a second via hole, and the second via hole penetrates through the light-shielding portion.

For example, a plurality of conductive lines are provided, and an orthographic projection of at least one of the plurality of conductive lines overlaps with the orthographic projection of the first via hole on the base substrate.

For example, a material of the second conductive element includes a metal, and a material of the conductive line includes a transparent conductive material.

At least one embodiment of the present disclosure further provides a display substrate, including: a base substrate, including a first display region and a second display region; a pixel unit, located on the base substrate, wherein the pixel unit includes a pixel circuit and a light-emitting element, the pixel circuit is configured to drive the light-emitting element, the pixel unit includes a first pixel unit and a second pixel unit, the pixel circuit and the light-emitting element of the first pixel unit are both located in the first display region, the pixel circuit of the second pixel unit is located in the first display region, the light-emitting element of the second pixel unit is located in the second display region, and the pixel circuit of the second pixel unit is connected to the light-emitting element of the second pixel unit through a conductive line; a connection element, connected to the pixel circuit, and including a first connection element and a second connection element, wherein the pixel circuit of the first pixel unit is connected to the light-emitting element of the first pixel unit through the first connection element, the pixel circuit of the second pixel unit is connected to the conductive line through the second connection element, and the connection element includes a first connection electrode and a second connection electrode; a first planarization layer, located on the first connection electrode, wherein the second connection electrode is located on the first planarization layer and is connected to the first connection electrode through a first via hole penetrating through the first planarization layer; and a second planarization layer, located on the second connection electrode, wherein the conductive line is located on the second planarization layer; the second connection electrode is recessed at the first via hole, the second planarization layer has a light-shielding portion, and an orthographic projection of the first via hole on the base substrate falls within an orthographic projection of the light-shielding portion on the base substrate.

For example, the pixel circuit includes a driving transistor, and the driving transistor includes a gate electrode; the display substrate further includes: a first gate signal line, connected to the gate electrode of the driving transistor; a constant voltage line, configured to provide a first constant voltage to the pixel circuit; and a shield electrode, connected to the constant voltage line; an orthographic projection of the first gate signal line on the base substrate falls within an orthographic projection of the shield electrode on the base substrate, the first planarization layer is located on the constant voltage line, the shield electrode is located on the first planarization layer, the second planarization layer is located on the shield electrode, and the shield electrode is connected to the constant voltage line through a second via hole penetrating through the first planarization layer; the shield electrode is recessed at the via hole so that the shield electrode has a recessed portion and a peripheral portion located at an outer side of the recessed portion, the recessed portion of the shield electrode has a bottom portion and a side portion, the bottom portion of the shield electrode is connected to the peripheral portion of the shield electrode through the side portion of the shield electrode; and an orthographic projection of the via hole on the base substrate falls within the orthographic projection of the light-shielding portion on the base substrate.

For example, the second connection electrode is connected to the conductive line or the light-emitting element of the first pixel unit through a second via hole, and the second via hole penetrates through the light-shielding portion.

At least one embodiment of the present disclosure further provides a manufacturing method of a display substrate, including: forming a first conductive element on a base substrate; forming a first planarization layer on the first conductive element; forming a second conductive element on the first planarization layer, wherein the second conductive element is connected to the first conductive element through a first via hole penetrating through the first planarization layer; forming a second planarization layer on the second conductive element; and forming a conductive line on the second planarization layer; the second conductive element is recessed at the first via hole; the forming the second planarization layer includes doping a photochromic material in a base material to form a planarization film, and performing a light irradiation treatment on the planarization film so that the second planarization layer has a light-shielding portion, and an orthographic projection of the first via hole on the base substrate falls within an orthographic projection of the light-shielding portion on the base substrate, or forming the conductive line by using a negative photoresist.

For example, the photochromic material includes a material which is black in itself and turns transparent after light irradiation, and the light irradiation treatment is performed on an opposite side of the display substrate with respect to a side where the second planarization layer is disposed.

For example, the photochromic material includes a material which is transparent in itself and turns black after light irradiation, and the light irradiation treatment is performed on a side of the display substrate where the second planarization layer is disposed.

For example, in the manufacturing method, the second conductive element has a recessed portion and a peripheral portion at an outer side of the recessed portion, the recessed portion has a bottom portion and a side portion, and the bottom portion is connected to the peripheral portion through the side portion.

At least one embodiment of the present disclosure further provides a display device, including the display substrate described in any of the above.

For example, the display device further includes a photosensitive sensor, the photosensitive sensor is located at one side of the display substrate.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure more apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the continuous development of mobile phone screens, full-screen mobile phones and under-screen camera technology have become hot spots. In order to improve the PPI (Pixel Per Inch) and the transmittance of the camera region, the light-emitting elements usually remain in the under-screen camera region, while the driving circuits of the light-emitting elements are placed at other positions. For example, the driving circuit can be externally disposed or adopt a compressed design, and a transparent conductive line is usually utilized to connect the light-emitting element to the driving circuit so that the light-emitting element is driven to emit light.

Figure 1:
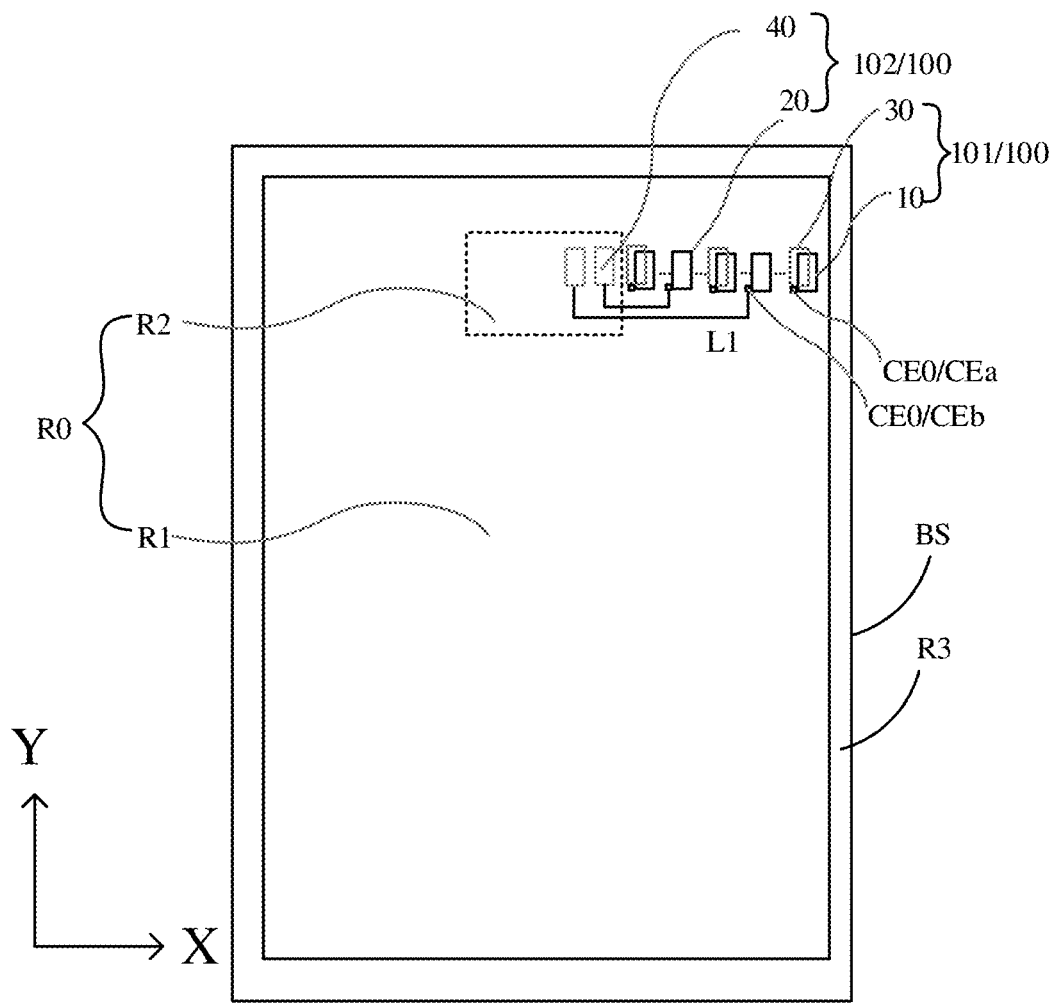
FIG. 1 is a schematic diagram of a display substrate.

FIG. 1 is a schematic diagram of a display substrate. As shown in FIG. 1, the display substrate includes a display region R0 and a peripheral region R3. The peripheral region R3 is a non-display region. The display region R0 includes a first display region R1 and a second display region R2. For example, hardware, such as a photosensitive sensor (e.g., a camera), etc., is arranged at a position corresponding to the second display region R2 on one side of the display substrate. For example, the second display region R2 is a light-transmitting display region, and the first display region R1 is a display region. For example, the first display region R1 is opaque and only used for display. The first display region R1 and the second display region R2 together form the region of the display screen of the display substrate.

As shown in FIG. 1, the display substrate includes a base substrate BS and a pixel unit 100 located on the base substrate BS. The pixel unit 100 includes a first pixel unit 101 and a second pixel unit 102, the first pixel unit 101 includes a first pixel circuit 10 and a first light-emitting element 30, and the second pixel unit 102 includes a second pixel circuit 20 and a second light-emitting element 40. The first pixel circuit 10 and the first light-emitting element 30 of the first pixel unit 101 are both located in the first display region R1, the second pixel circuit 20 of the second pixel unit 101 is located in the first display region R1, and the second light-emitting element 40 of the second pixel unit 102 is located in the second display region R2. For example, the first pixel circuit 10 can be referred to as an in-situ pixel circuit, and the second pixel circuit 20 can be referred to as an ex-situ pixel circuit. The first pixel circuit 10 and the second pixel circuit 20 are both driving circuits. As shown in FIG. 1, in the second display region R2, there is a light-transmitting sub-region between adjacent second light-emitting elements 40, and the region where the second light-emitting element 40 is located is a display sub-region.

For example, as shown in FIG. 1, the display substrate includes a plurality of first pixel circuits 10, a plurality of second pixel circuits 20 and a plurality of first light-emitting elements 30 that are located in the first display region R1;
and a plurality of second light-emitting elements 40 located in the second display region R2. For example, the plurality of second pixel circuits 20 can be distributed, at intervals, among the plurality of first pixel circuits 10.

In order to improve the light transmittance of the second display region R2, only light-emitting elements may be arranged in the second display region R2, and the pixel circuits for driving the light-emitting elements of the second display region R2 can be arranged in the first display region R1. That is, the light transmittance of the second display region R2 is improved by separately arranging the light-emitting elements and the pixel circuits. That is, in the second display region R2, no pixel circuit is provided.

For example, as shown in FIG. 1, at least one first pixel circuit 10 of the plurality of first pixel circuits 10 can be connected to at least one first light-emitting element 30 of the plurality of first light-emitting elements 30, and the orthographic projection of the at least one first pixel circuit 10 on the base substrate BS can at least partially overlap with the orthographic projection of the at least one first light-emitting element 30 on the base substrate BS. The at least one first pixel circuit 10 can be configured to provide a driving signal for the first light-emitting element 30 connected thereto, so as to drive the first light-emitting element 30 to emit light.

FIG. 1 illustrates the case where the second pixel circuit 20 used for driving the second light-emitting element 40 to emit light is located in the first display region R1 by way of example. In this case, the display substrate can adopt a compressed driving circuit scheme; in the compressed driving circuit scheme, the size of the driving circuit in the first direction X is reduced, so that the first pixel circuit 10 and the second pixel circuit 20 can be placed in the first direction X, and the second pixel circuits 20 can be distributed among the first pixel circuits 10. For example, the first direction X is a row direction, and in a same row of pixel circuits, the second pixel circuits 20 are arranged at intervals among the first pixel circuits 10. Of course, in some other embodiments, the second pixel circuit 20 can also be located in the peripheral region R3, thus forming an external driving circuit scheme.

For example, as shown in FIG. 1, the first display region R1 can be located at at least one side of the second display region R2. For example, in some embodiments, the first display region R1 surrounds the second display region R2. That is, the second display region R2 can be surrounded by the first display region R1. The second display region R2 can also be arranged at other positions, and the arrangement position of the second display region R2 can be determined according to needs. For example, the second display region R2 can be located at the top middle position of the base substrate BS, or can be located at the upper left position or the upper right position of the base substrate BS.

For example, as shown in FIG. 1, at least one second pixel circuit 20 of the plurality of second pixel circuits 20 can be connected to at least one second light-emitting element 40 of the plurality of second light-emitting elements 40 through a conductive line L1, and the at least one second pixel circuit 20 can be configured to provide a driving signal for the second light-emitting element 40 connected thereto, so as to drive the second light-emitting element 40 to emit light. As shown in FIG. 1, because the second light-emitting element 40 and the second pixel circuit 20 are located in different regions, there is no overlap between the orthographic projection of the at least one second pixel circuit 20 on the base substrate BS and the orthographic projection of the at least one second light-emitting element 40 on the base substrate BS.

For example, in the embodiments of the present disclosure, the first display region R1 can be set as a light-shielding display region, and the second display region R2 can be set as a light-transmitting display region. For example, the first display region R1 cannot transmit light, and the second display region R2 can transmit light. In this way, the display substrate provided by the embodiment of the present disclosure does not need to perform a drilling process on the display substrate, and the required hardware structure, such as the photosensitive sensor, etc., can be directly arranged at a position corresponding to the second display region R2 on one side of the display substrate, which provides a solid foundation for the realization of a true full screen. Moreover, because the second display region R2 only includes light-emitting elements and does not include pixel circuits, it is beneficial to increase the light transmittance of the second display region R2, so that the display substrate has a better display effect.

For example, as shown in FIG. 1, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line. Of course, in some other embodiments, the second light-emitting element 40 and the second pixel circuit 20 connected to the second light-emitting element 40 may not be located in the same row.

As shown in FIG. 1, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of a conductive oxide material. For example, the conductive oxide material includes indium tin oxide (ITO), but is not limited thereto.

As shown in FIG. 1, one end of the conductive line L1 is connected to the second pixel circuit 20, and the other end of the conductive line L1 is connected to the second light-emitting element 40. As shown in FIG. 1, the conductive line L1 extends from the first display region R1 to the second display region R2.

Figure 2:
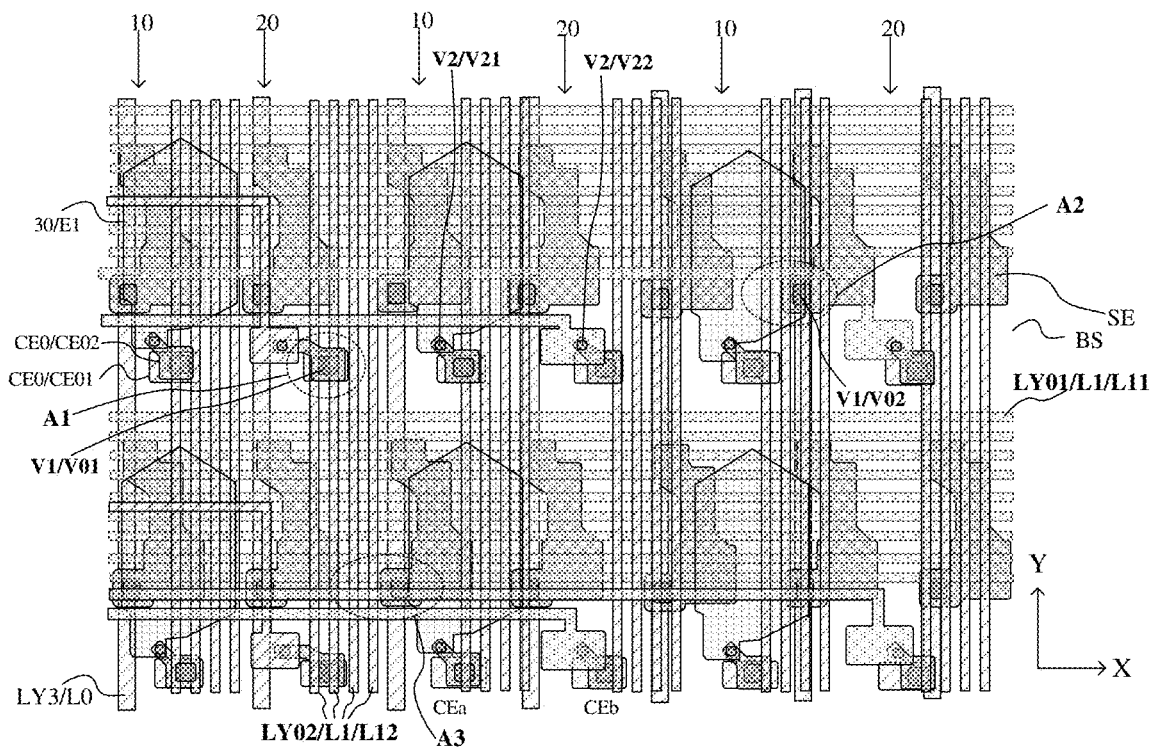
FIG. 2 is a schematic diagram illustrating a partial structure of a display substrate.
Figure 3:
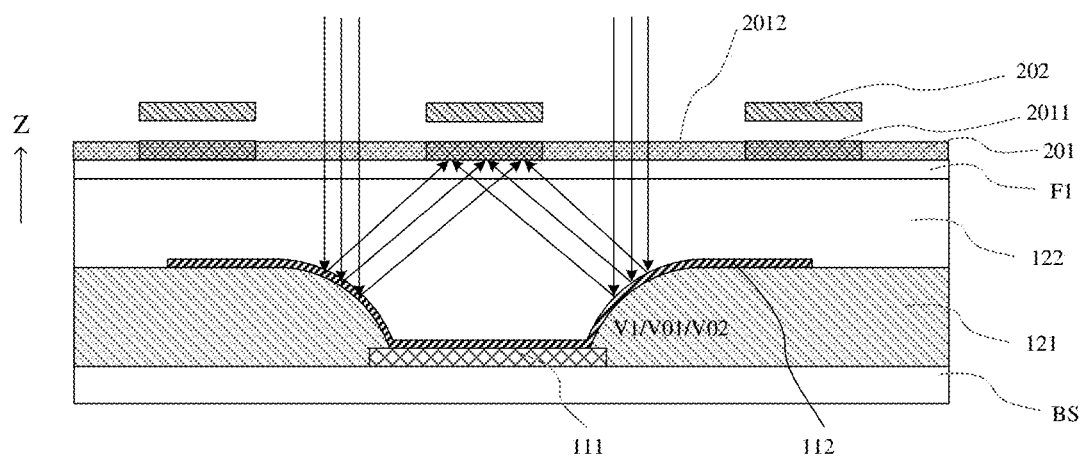
FIG. 3 is a schematic diagram (the cross-sectional view at position A1, A2 or A3 in FIG. 2) of an exposure step when patterning a transparent conductive film in a process of forming a conductive line illustrated in FIG. 2.
Figure 4:
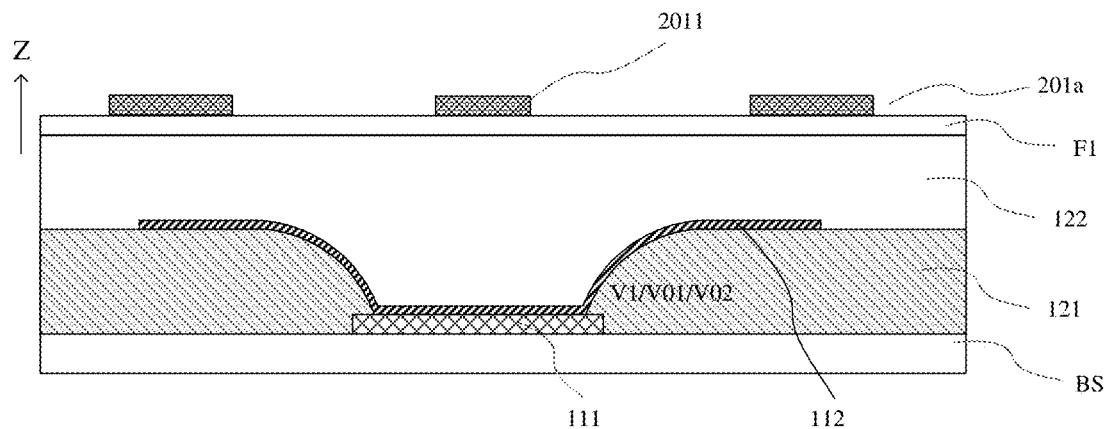
FIG. 4 is a schematic diagram of forming a photoresist pattern.
Figure 5:
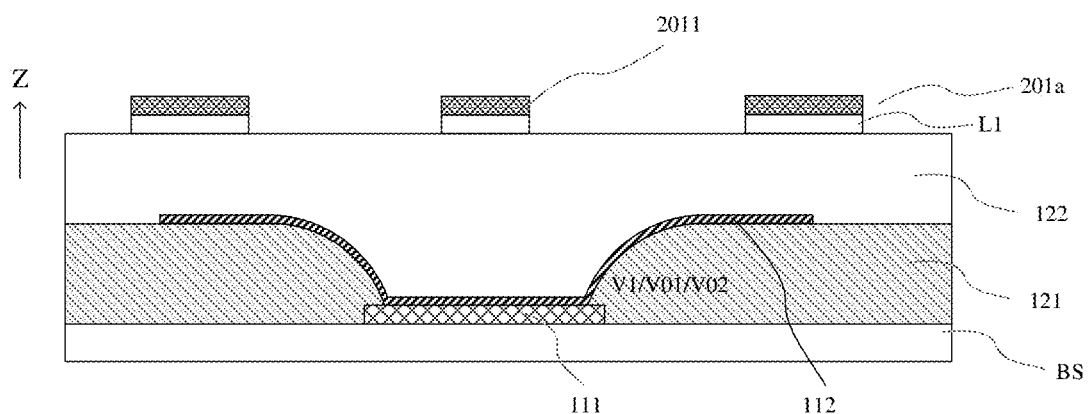
FIG. 5 is a schematic diagram of forming a conductive line.

FIG. 2 is a schematic diagram illustrating a partial structure of a display substrate. FIG. 3 is a schematic diagram (a cross-sectional view at position A1, A2 or A3 in FIG. 2) of an exposure step when patterning a transparent conductive film in a process of forming a conductive line shown in FIG. 2. FIG. 4 is a schematic diagram of forming a photoresist pattern. FIG. 5 is a schematic diagram of forming a conductive line. As shown in FIG. 2 and FIG. 3, a first conductive element 111 is located on the base substrate BS; a first planarization layer 121 is located on the first conductive element 111; a second conductive element 112 is located on the first planarization layer 121, and is connected to the first conductive element 111 through a first via hole V1 penetrating through the first planarization layer 121; and a second planarization layer 122 is located on the second conductive element 112. For example, the first via hole V1 shown in FIG. 3 includes a via hole V01 or V02 shown in FIG. 2.

As shown in FIG. 3, forming the conductive line L1 includes: forming a transparent conductive film F1 on the second planarization layer 122, forming a photoresist film 201 on the transparent conductive film F1, and exposing the photoresist film 201 with a mask plate 202 as a mask, so that the photoresist film 201 is formed into a photoresist portion to be retained 2011 and a photoresist portion to be removed 2012. As shown in FIG. 4, the exposure process is followed by a development process, and in the development process, the photoresist portion to be removed 2012 is removed to form a photoresist pattern 201a. As shown in FIG. 5, the transparent conductive film F1 is etched with the photoresist pattern 201a as a mask to form a conductive line L1. The second conductive element 112 in FIG. 3 can be a connection element CEO or a shield electrode SE shown in FIG. 2. As shown in FIG. 3, the mask plate 202 includes an opening region and a shielding region, the opening region of the mask plate 202 corresponds to the photoresist portion to be removed 2012, and the shielding region of the mask plate 212 corresponds to the photoresist portion to be retained 2011. The photoresist film 201 is formed using a positive photoresist.

As shown in FIG. 2, a plurality of conductive lines L1 is provided, and the plurality of conductive lines L1 include a plurality of first conductive lines L11 located in a first transparent conductive layer LY01 and a plurality of second conductive lines L12 located in a second transparent conductive layer LY02. An insulating layer can be disposed between the first transparent conductive layer LY01 and the second transparent conductive layer LY02. In some other embodiments, three or more transparent conductive layers can be included so as to provide more conductive lines. The insulating layer is arranged between adjacent transparent conductive layers.

After the exposure process, the photoresist of the transparent conductive film may be over-exposed and thinned, which leads to the breakage or thinning of the conductive line after development and etching, thus causing the display to have a defect of dark spot. The optical microscope has confirmed that the broken and thinned position of the conductive line is the position where the conductive line spans the first via hole V1 of the first planarization layer 121. Further, through a Focused Ion Beam (FIB) analysis on the cross-section of the first via hole V1 of the first planarization layer 121, it has been found that, there is a bowl-shaped portion of the second conductive element 112 under the broken or thinned position where the conductive line spans the first via hole V1. Therefore, as shown in FIG. 3, the reason why the conductive line is broken and thinned is that: in the exposure process, the second conductive element 112 reflects light and condenses it to the photoresist portion to be retained 2011 of the photoresist located above the bowl-shaped portion of the second conductive element 112 (corresponding to the position of the first via hole V1), so that this portion of the photoresist is exposed or partially exposed, and washed away after development, and further, the conductive line formed by etching the transparent conductive film with the photoresist pattern 201a as a mask is broken or thinned. As shown in FIGS. 3-5, the photoresist portion to be retained 2011 of the photoresist located in the middle position is irradiated by partially reflected light, which makes the conductive line under it thinner. It should be noted that, the bowl-shaped portion of the second conductive element 112 may also have other shapes, such as strip shape and groove shape. As long as the second conductive element 112 includes a light condensing structure, it will affect the photoresist above the light condensing structure in the exposure process of forming the conductive line, which will further lead to the breakage or thinning of the conductive line.

FIG. 2 shows the first light-emitting element 30, which is represented by the first electrode E1 of the first light-emitting element 30. FIG. 2 shows first pixel circuit columns and second pixel circuit columns arranged alternately. In some other embodiments, a plurality of first pixel circuit columns can be arranged between adjacent second pixel circuit columns.

FIG. 2 further shows a second via hole V2, and the second via hole V2 includes a via hole V21 or a via hole V22. The via hole V21 and the via hole V22 both are via holes penetrating through at least one insulating layer. As shown in FIG. 2, the first electrode E1 of the first light-emitting element 30 is connected to the connection element CE0 through a via hole V21. As shown in FIG. 1 and FIG. 2, one end of the conductive line L1 is connected to the connection element CE0 through a via hole V22. As shown in FIG. 1 the other end of the conductive line L1 is connected to the first electrode E1 of the second light-emitting element 40. That is, the connection element CE0 is connected to one end of the conductive line L1 through the second via hole V2, or the connection element CE0 is connected to the first electrode E1 of the first light-emitting element 30 through the second via hole V2. For example, the connection element CE0 connected to the first electrode E1 of the first light-emitting element 30 can be referred to as a first connection element CEa (see FIG. 1 and FIG. 2), and the connection element CE0 connected to the conductive line L1 can be referred to as a second connection element CEb (see FIG. 1 and FIG. 2). For example, the connection element CE0 connected to the pixel circuit of the first pixel unit can be referred to as a first connection element CEa (see FIG. 1 and FIG. 2), and the connection element CE0 connected to the pixel circuit of the second pixel unit can be referred to as a second connection element CEb (see FIG. 1 and FIG. 2).

The display substrate provided by the embodiment shown in each figure of the present disclosure is described with reference to the case where one conductive line L1 is connected to one second pixel circuit and one second light-emitting element, by way of example. In some other embodiments, one conductive line can also be connected to a plurality of second light-emitting elements.

Figure 6:
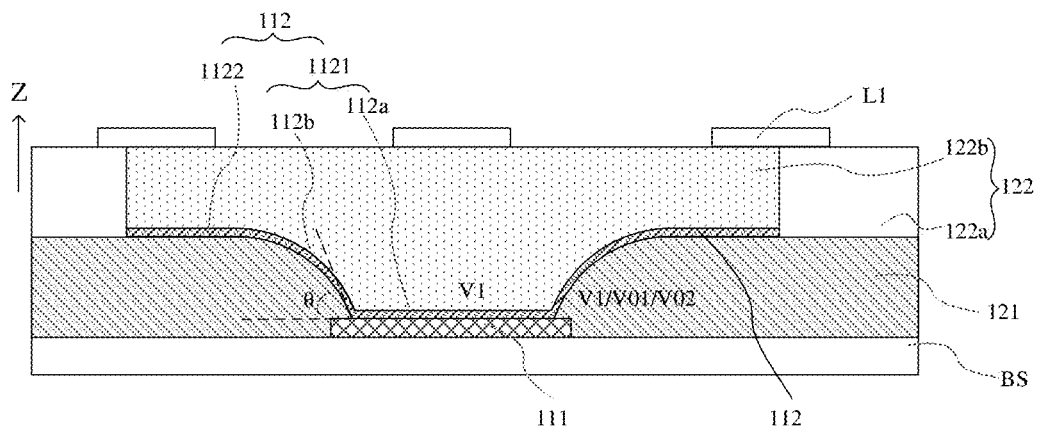
FIG. 6 is a schematic diagram of a display substrate provided by an embodiment of the present disclosure.
Figure 7:
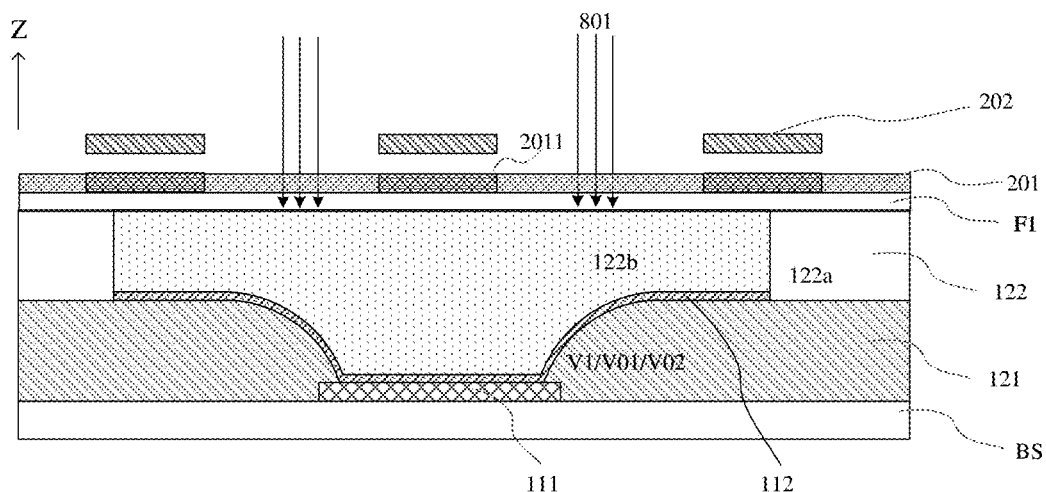
FIG. 7 is a schematic diagram illustrating a light-shielding portion of a second planarization layer in a display substrate absorbing light irradiated thereon, as provided by an embodiment of the present disclosure.

FIG. 6 is a schematic diagram of a display substrate provided by an embodiment of the present disclosure. FIG. 7 is a schematic diagram illustrating a light-shielding portion of a second planarization layer in a display substrate absorbing light irradiated thereon, as provided by an embodiment of the present disclosure. As shown in FIG. 6, the display substrate includes a base substrate BS, a first conductive element 111, a first planarization layer 121, a second conductive element 112, a second planarization layer 122, and a conductive line L1. As shown in FIG. 6, the first conductive element 111 is located on the base substrate BS; the first planarization layer 121 is located on the first conductive element 111; the second conductive element 112 is located on the first planarization layer 121, and is connected to the first conductive element 111 through a first via hole V1 penetrating through the first planarization layer 121; the second planarization layer 122 is located on the second conductive element 112; and the conductive line L1 is located on the second planarization layer 122.

For example, the base material of the first planarization layer 121 and the second planarization layer 122 includes an organic polymer material, and the organic polymer material include a resin but is not limited thereto. For example, the base material of the first planarization layer 121 and the second planarization layer 122 includes polymethylmethacrylate (PMMA) or Polyimide (PI), but is not limited thereto. The first planarization layer 121 and the second planarization layer 122 provided by the embodiments of the present disclosure can be formed by doping a photochromic material in the base material, which will be described below in detail.

As shown in FIG. 6, the second conductive element 112 is recessed at the first via hole V1. As shown in FIG. 6, the second conductive element 112 has a recessed portion 1121 and a peripheral portion 1122 at an outer side of the recessed portion 1121. The recessed portion 1121 has a bottom portion 112a and a side portion 112b, and the bottom portion 112a is connected to the peripheral portion 1122 through the side portion 112b. As shown in FIG. 6, the second planarization layer 122 has a light-shielding portion 122b, and the orthographic projection of the first via hole V1 on the base substrate BS falls within the orthographic projection of the light-shielding portion 122b on the base substrate BS. Therefore, as shown in FIG. 7, in the process of exposing the photoresist during forming the conductive line L1, the light irradiated on the light-shielding portion 122b is absorbed, and the light gathered on the photoresist portion to be retained 2011 on the first via hole V1 is avoided or reduced. Thus, the conductive line L1 spanning the first via hole V1 is not broken or thinned at the first via hole V1, and the generation of the defect of dark spot during display is avoided. In FIG. 7, the reference numeral 801 denotes light 801 used in the photolithography process of forming the conductive line.

In the embodiments of the present disclosure, the recessed portion 1121 can be regarded as the part of the second conductive element 112 which is located within the first via hole V1. For example, the orthographic projection of the recessed portion 1121 on the base substrate BS overlaps with the orthographic projection of the first via hole V1 on the base substrate BS.

In the display substrate provided by the embodiment of the present disclosure, with the aid of the light-shielding portion 122b in the second planarization layer 122, light irradiated on the light-shielding portion 122b during the exposure process is absorbed so that the light is no longer irradiated on the surface of the bowl-shaped portion of the second conductive element 112, thus eliminate the gathering of the light, avoiding the breakage and thinning of the conductive line caused by photoresist overexposure, and hence solving the problem of the defect of dark spot.

For example, as shown in FIG. 6, the side portion 112b has an included angle θ with the base substrate BS. Accordingly, as shown in FIG. 6, the tangent of the portion of the first planarization layer 121 forming the first via hole V1 also has an included angle θ with the base substrate BS. In other words, the side portion 112b is disposed obliquely with respect to the main surface of the base substrate BS, and the portion of the first planarization layer 121 forming the first via hole V1 is disposed obliquely with respect to the main surface of the base substrate BS. The included angle θ is an acute angle. For example, the included angle θ is greater than or equal to 20 degrees and less than or equal to 80 degrees, but it is not limited thereto. For example, the included angle θ is greater than or equal to 30 degrees and less than or equal to 60 degrees, but it is not limited thereto. The value of the included angle is not limited in the embodiment of the present disclosure. For example, because the side portion 112b may not be flat, the angle between the side portion 112b and the base substrate BS may refer to the angle between the tangent of the side portion 112*b* and the base substrate BS, and the angle between the base substrate BS and the side portion 112*b* may refer to the angle between the base substrate BS and the connecting line of the two endpoints of the side portion 112*b*. For example, because the portion of the first planarization layer 121 forming the first via hole V1 may not be flat, the angle between the portion of the first planarization layer 121 forming the first via hole V1 and the base substrate BS may refer to the angle between the tangent of the portion of the first planarization layer 121 forming the first via hole V1 and the base substrate BS, and the angle between the base substrate BS and the portion of the first planarization layer 121 forming the first via hole V1 may refer to the angle between the base substrate BS and the connecting line of the two endpoints of the portion of the first planarization layer 121 forming the first via hole V1.

For example, as shown in FIG. 6, in some embodiments, the bottom portion 112*a* of the recessed portion 1121 refers to the part of the recessed portion 1121 that contacts the first conductive element 111, and the side portion 112*b* of the recessed portion 1121 refers to the part of the recessed portion 1121 that contacts the portion of the first planarization layer 121 forming the first via hole, but they are not limited thereto.

The figures of the embodiments of the present disclosure show at least one of the first direction X, the second direction Y, and the third direction Z. The main surface of the base substrate BS is the surface where each component is arranged, the first direction X and the second direction Y are directions parallel to the main surface of the base substrate BS, and the third direction Z is a direction perpendicular to the main surface of the base substrate BS. For example, the first direction X is intersected with the second direction Y. Further, for example, the first direction X is perpendicular to the second direction Y.

For example, as shown in FIG. 6, the peripheral portion 1122 is parallel to the base substrate BS. In the embodiments of the present disclosure, the peripheral portion 1122 can be regarded as the portion of the second conductive element 112 located at the outer side of the first via hole V1. For example, the orthographic projection of the peripheral portion 1122 on the base substrate BS does not overlap with the orthographic projection of the first via hole V1 on the base substrate BS.

For example, as shown in FIG. 6, the portion of the first planarization layer 121 other than the portion at the position of the sidewall of the first via hole V1 has a flat surface. For example, as shown in FIG. 6, the bottom portion 112*a* of the second conductive element 112 is parallel to the peripheral portion 1122.

For example, the material of the second conductive element 112 includes a metal, and for example, the metal includes at least one of titanium, molybdenum and aluminum, but is not limited thereto. For example, the material of the conductive line L1 includes a transparent conductive material, which can be referred to the above description and will not be repeated here.

For example, as shown in FIG. 6, the second planarization layer 122 further has a light-transmitting portion 122*a*, and the orthographic projection of the first via hole V1 on the base substrate BS does not overlap with the orthographic projection of the light-transmitting portion 122*a* on the base substrate BS. The second planarization layer 122 further has a light-transmitting portion 122*a*, which facilitates light to pass through the display substrate, thereby facilitating the sensor disposed in the second display region R2 of the display substrate to receive the light transmitted through the display substrate.

For example, as shown in FIG. 6, the orthographic projection of the light-shielding portion 122*b* on the base substrate BS overlaps with the orthographic projection of the second conductive element 112 on the base substrate BS.

For example, the second planarization layer 122 includes a photochromic material. For example, the photochromic phenomenon refers to a reversible process in which the absorption spectrum of a compound changes after light irradiation. Substances with this property are referred to as photochromic materials.

For example, the photochromic material is doped, as a doping material, in the base material of forming the second planarization layer 122. The base material of the second planarization layer 122 can be those as described above, and will not be repeated here.

For example, in some embodiments, the photochromic material includes a material which is black in itself and turns transparent after light irradiation, and the orthographic projection of the second conductive element 112 on the base substrate BS falls within the orthographic projection of the light-shielding portion 122*b* on the base substrate BS.

For example, the photochromic material includes a material which is transparent in itself and turns black after light irradiation, and the orthographic projection of the first via hole V1 on the base substrate BS coincides with the orthographic projection of the light-shielding portion 122*b* on the base substrate BS.

Figure 8:
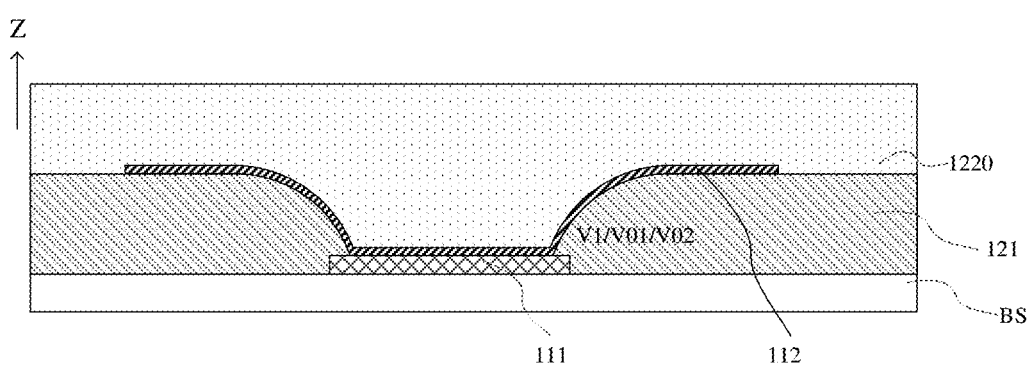
FIG. 8 is a schematic diagram of forming a second planarization film in a manufacturing process of a display substrate provided by an embodiment of the present disclosure.

FIG. 8 is a schematic diagram of forming a second planarization film in a manufacturing process of a display substrate provided by an embodiment of the present disclosure. Referring to FIG. 6 and FIG. 8, the manufacturing method of the display substrate includes the following steps.

Step S11: as shown in FIG. 6 and FIG. 8, a first conductive element 111 is formed on a base substrate BS.

For example, forming the first conductive element 111 includes: forming a first film by using a conductive material, forming a photoresist film on the first film, performing an exposure and development process on the photoresist film to form a photoresist pattern, etching the first film with the photoresist pattern as a mask, and removing the photoresist pattern, so as to form the first conductive element 111.

Step S12: as shown in FIG. 6 and FIG. 8, a first planarization layer 121 is formed on the first conductive element 111.

For example, forming the first planarization layer 121 includes forming a first planarization film, performing an exposure and development process on the first planarization film to form a first via hole V1 in the first planarization film, so as to form the first planarization layer 121.

Step S13: as shown in FIG. 6 and FIG. 8, a second conductive element 112 is formed on the first planarization layer 121, and the second conductive element 112 is connected to the first conductive element 111 through the first via hole V1 penetrating through the first planarization layer 121.

For example, forming the second conductive element 112 includes: forming a second film by using a conductive material, forming a photoresist film on the second film, performing an exposure and development process on the photoresist film to form a photoresist pattern, etching the second film with the photoresist pattern as a mask, and removing the photoresist pattern, so as to form the second conductive element 112.

Step S14: as shown in FIG. 6, a second planarization layer 122 is formed on the second conductive element 112.

Step S15: as shown in FIG. 6, a conductive line L1 is formed on the second planarization layer 122. As shown in FIG. 6, the second conductive element 112 is recessed at the first via hole V1. For example, the second conductive element 112 has a recessed portion 1121 and a peripheral portion 1122 at the outer side of the recessed portion 1121. The recessed portion 1121 has a bottom portion 112a and a side portion 112b, and the bottom portion 112a is connected to the peripheral portion 1122 through the side portion 112b.

As shown in FIG. 8, forming the second planarization layer 122 includes: doping a photochromic material in a base material to form a second planarization film (a planarization film) 1220.

Figure 9A:
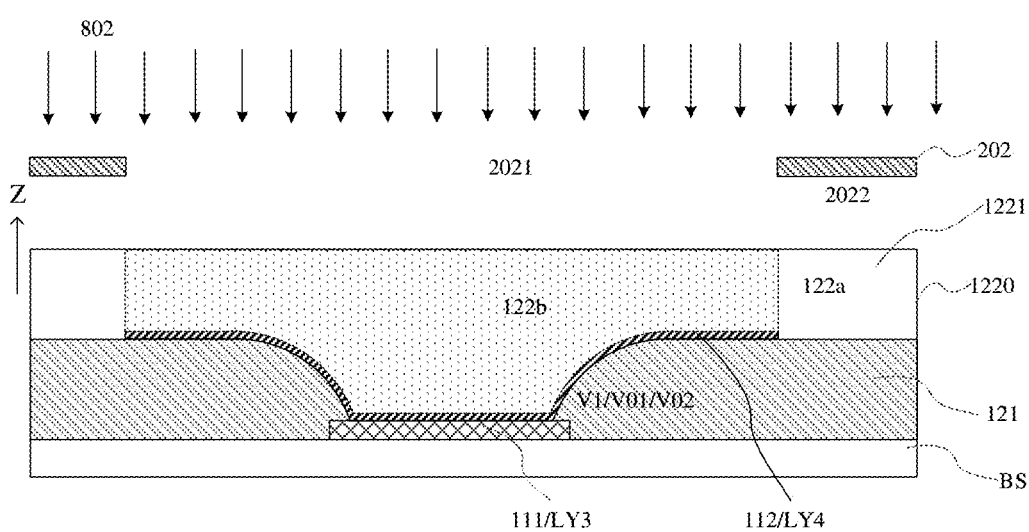
FIG. 9A is a schematic diagram of performing a light irradiation treatment on a second planarization film in a manufacturing process of a display substrate provided by an embodiment of the present disclosure.

FIG. 9A is a schematic diagram of performing a light irradiation treatment on a second planarization film in a manufacturing process of a display substrate provided by an embodiment of the present disclosure. FIG. 9A shows the second planarization film 1220. For example, the photochromic material includes a material which is transparent in itself and turns black after light irradiation. For example, the material that is transparent in itself and turns black after light irradiation includes silver halide, but it is not limited thereto, and can be selected according to needs. The embodiment of the present disclosure illustrates the case where the material that is transparent in itself and turns black after light irradiation is silver halide by way of example. For example, the doping particles (silver halide particles) are dispersed in the base material of forming the second planarization layer, and the silver halide microcrystals turn black under the irradiation of ultraviolet light, so that a light-shielding portion 122b can be formed. For example, the silver halide microcrystals that turn black are reversed by heating under dark conditions, so as to become colorless.

For example, as shown in FIG. 9A, the photochromic material includes a material 1221 which is transparent in itself and turns black after light irradiation. Light 802 is irradiated from the front surface of the display substrate, that is, a light irradiation treatment is performed on the side of the display substrate where the second planarization layer 122 is formed. In other words, the light irradiation treatment is performed on the side of the display substrate where the second planarization film is formed. FIG. 9A shows a mask plate 202. The mask plate 202 includes a shielding region 2022 and an opening region 2021. The shielding region 2022 corresponds to the light-transmitting portion 122a, and the opening region 2021 corresponds to the light-shielding portion 122b. That is, after being irradiated by the light 802, the part of the second planarization film 1220 corresponding to the opening region 2021 is formed into the light-shielding portion 122b, and FIG. 9A outlines the light-shielding portion 122b with a dashed line; the part of the second planarization film 1220 corresponding to the shielding region 2022 is formed into the light-transmitting portion 122a. The doping material includes the material 1221 which is transparent in itself and turns black after light irradiation, thus the light-shielding portion 122b and the light-transmitting portion 122a can be formed by means of the mask plate 202. The mask plate 202 shown in FIG. 9A can adopt a mask plate used for forming the second conductive element 112. In this case, the orthographic projection of the light-shielding portion 122b on the base substrate BS coincides with the orthographic projection of the second conductive element 112 on the base substrate BS. As shown in FIG. 9A, the second conductive element 112 is located in a fourth conductive layer LY4. For example, the mask plate 202 shown in FIG. 9A can adopt a mask plate used for forming the fourth conductive layer LY4, and the orthographic projection of the light-shielding portion 122b on the base substrate BS coincides with the orthographic projection of a component in the fourth conductive layer LY4 on the base substrate BS. Of course, in some other embodiments, the mask plate 202 shown in FIG. 9A can adopt a mask plate used for forming the first via hole V1, so that the orthographic projection of the light-shielding portion 122b on the base substrate BS coincides with the orthographic projection of the first via hole V1 on the base substrate BS. FIG. 9A shows that the first conductive element 111 is located in a third conductive layer LY3.

For example, as shown in FIG. 6 and FIG. 9A, the orthographic projection of the light-shielding portion 122b on the base substrate BS overlaps with the orthographic projection of the second conductive element 112 on the base substrate BS.

Figure 9B:
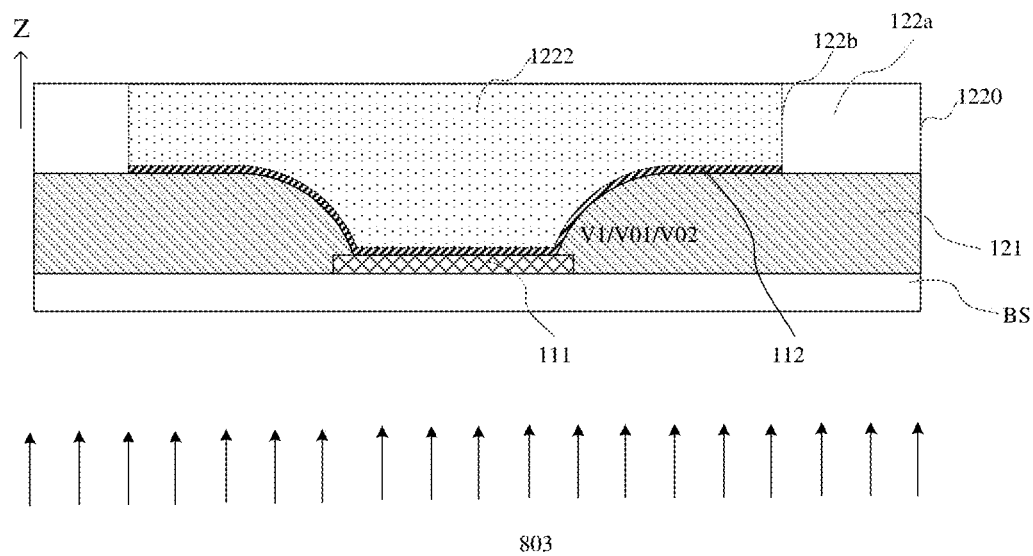
FIG. 9B is a schematic diagram of performing a light irradiation treatment on a second planarization film in a manufacturing process of a display substrate provided by another embodiment of the present disclosure.

FIG. 9B is a schematic diagram of performing a light irradiation treatment on a second planarization film in a manufacturing process of a display substrate provided by another embodiment of the present disclosure. For example, the photochromic material includes a material 1222 which is black in itself and turns transparent after light irradiation. For example, the material 1222 that is black in itself and turns transparent after light irradiation includes heterocyclic nitrogen oxides or azo dyes, but is not limited thereto, and other suitable materials can be selected as needed.

For example, the photochromic material includes the material 1222 which is black in itself and turns transparent after light irradiation. As shown in FIG. 9B, light 803 is irradiated from the back surface of the display substrate, that is, a light irradiation treatment is performed on an opposite side of the display substrate with respect to the side where the second planarization layer 122 is formed. In other words, the light irradiation treatment is performed on an opposite side of the display substrate with respect to the side where the second planarization film 1220 is formed. Therefore, the light-shielding portion 122b is formed in the region of the second planarization film 1220 corresponding to the second conductive element 112, and the light-transmitting portion 122a is formed in other regions of the second planarization film 1220.

For example, in some embodiments, in order to save the procedures, the light-shielding portion 122b is formed by using the second conductive element 112 as a mask. In this case, the orthographic projection of the light-shielding portion 122b on the base substrate BS coincides with the orthographic projection of the second conductive element 112 on the base substrate BS.

For example, as shown in FIG. 6 and FIG. 9B, the orthographic projection of the light-shielding portion 122b on the base substrate BS overlaps with the orthographic projection of the second conductive element 112 on the base substrate BS.

Referring to FIG. 6, FIG. 9A and FIG. 9B, forming the second planarization layer 122 further includes: performing a light irradiation treatment on the second planarization film 1220, so that the second planarization layer 122 has a light-shielding portion 122b, and the orthographic projection of the first via hole V1 on the base substrate BS falls within the orthographic projection of the light-shielding portion 122b on the base substrate BS.

Figure 10A:
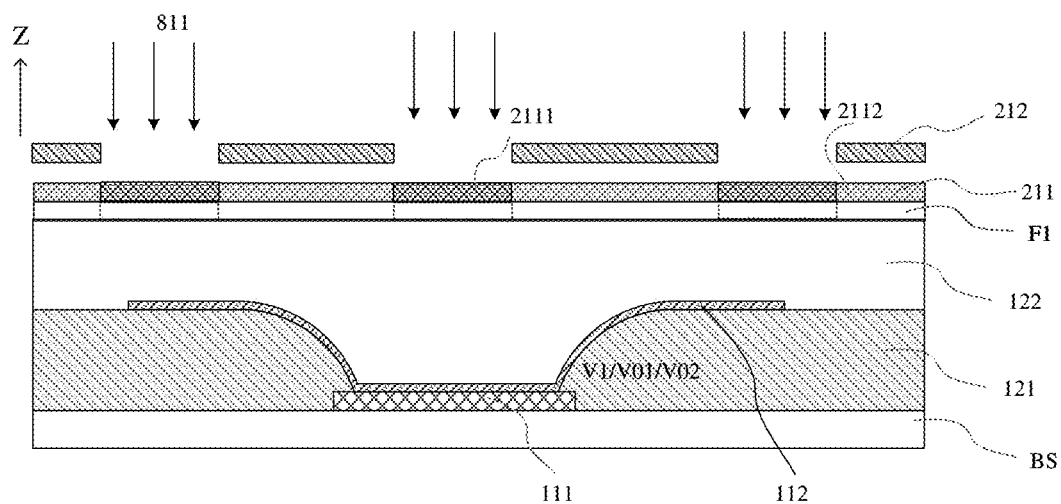
FIG. 10A is a schematic diagram of an exposure step of forming a conductive line in a manufacturing method of a display substrate provided by an embodiment of the present disclosure.
Figure 10B:
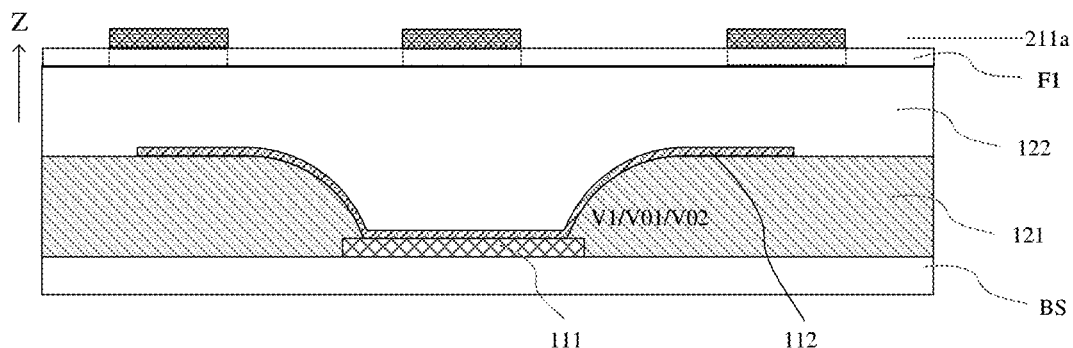
FIG. 10B is a schematic diagram of a photoresist pattern in a process of forming a conductive line in a manufacturing method of a display substrate provided by an embodiment of the present disclosure.
Figure 10C:
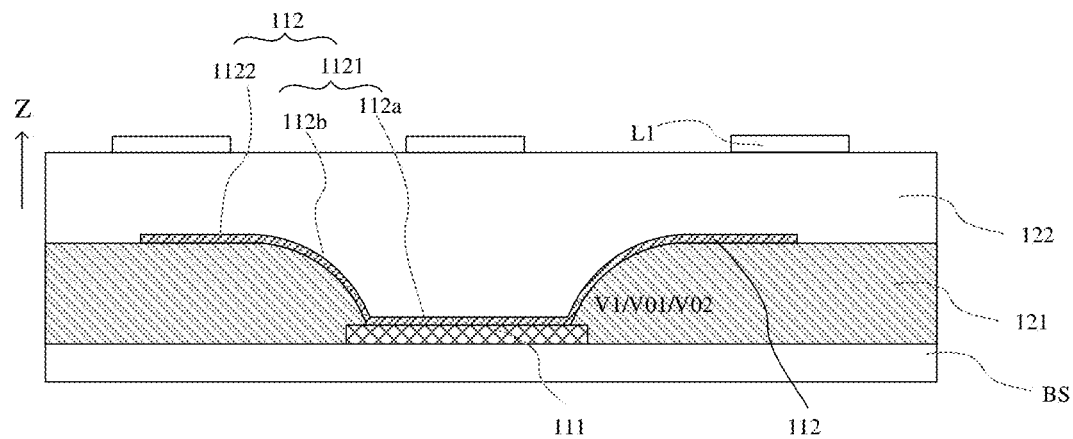
FIG. 10C is a schematic diagram of a display substrate formed by a manufacturing method of a display substrate provided by an embodiment of the present disclosure.

FIG. 10A is a schematic diagram of an exposure step of forming a conductive line in a manufacturing method of a display substrate provided by an embodiment of the present disclosure. FIG. 10B is a schematic diagram of a photoresist pattern in a process of forming a conductive line in a manufacturing method of a display substrate provided by an embodiment of the present disclosure. FIG. 10C is a schematic diagram of a display substrate formed by a manufacturing method of a display substrate provided by an embodiment of the present disclosure.

An embodiment of the present disclosure further provides a manufacturing method of a display substrate, which includes the following steps.

Step S21: referring to FIG. 10A and FIG. 10C, forming a first conductive element 111 on a base substrate BS.

Step S22: referring to FIG. 10A and FIG. 10C, forming a first planarization layer 121 on the first conductive element 111.

Step S23: referring to FIG. 10A and FIG. 10C, forming a second conductive element 112 on the first planarization layer 121, wherein the second conductive element 112 is connected to the first conductive element 111 through a first via hole V1 penetrating through the first planarization layer 121.

Step S24: referring to FIG. 10A and FIG. 10C, forming a second planarization layer 122 on the second conductive element 112.

Step S25: referring to FIG. 10B and FIG. 10C, forming a conductive line L1 on the second planarization layer 122 by using a negative photoresist (photoresist pattern 211a), wherein the second conductive element 112 is recessed at the first via hole V1. For example, referring to FIG. 10C, the second conductive element 112 has a recessed portion 1121 and a peripheral portion 1122 at the outer side of the recessed portion 1121, the recessed portion 1121 has a bottom portion 112a and a side portion 112b, and the bottom portion 112a is connected to the peripheral portion 1122 through the side portion 112b.

As shown in FIG. 10A, forming the conductive line L1 includes: forming a transparent conductive film F1 on the second planarization layer 122, forming a photoresist film 211 on the transparent conductive film F1, and exposing the photoresist film 211 with light 811 by using the mask plate 212 as a mask, so that the photoresist film 211 is formed into a photoresist portion to be retained 2111 and a photoresist portion to be removed 2112. As shown in FIG. 10A and FIG. 10B, the exposure process is followed by a development process, and in the development process, the photoresist portion to be removed 2012 is removed, so as to form a photoresist pattern 211a. As shown in FIG. 10B and FIG. 10C, the transparent conductive film F1 is etched by using the photoresist pattern 211a as a mask, so as to form the conductive line L1. As shown in FIG. 10A, the mask plate 212 includes an opening region and a shielding region, the opening region of the mask plate 212 corresponds to the photoresist portion to be retained 2111, and the shielding region of the mask plate 212 corresponds to the photoresist portion to be removed 2112. FIG. 10A and FIG. 10B outline the conductive line L1 to be formed by using a dashed line.

Figure 11A:
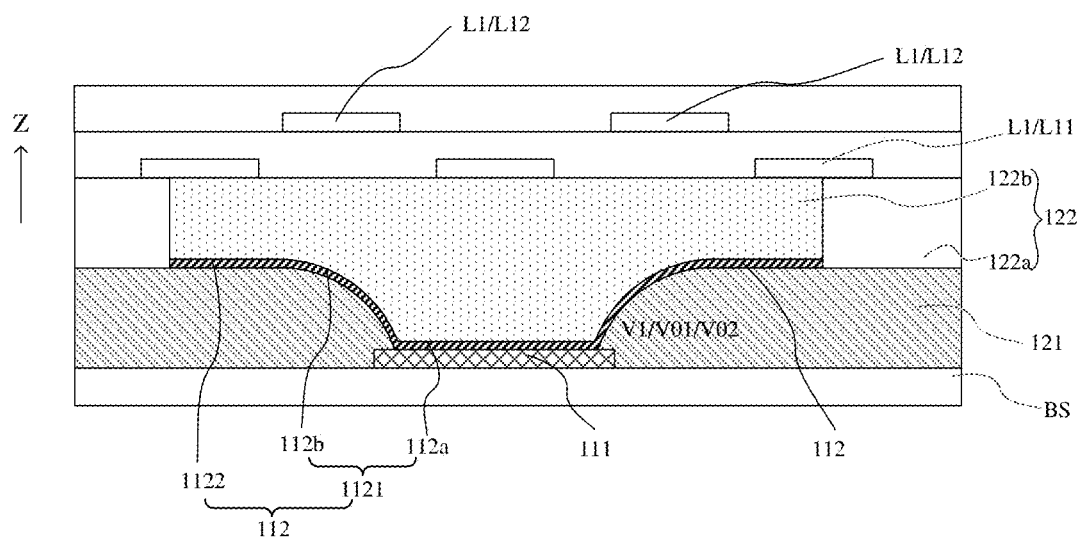
FIG. 11A is a schematic diagram of a display substrate provided by an embodiment of the present disclosure.

For example, the orthographic projection of at least one conductive line L1 on the base substrate partially overlaps with the orthographic projection of the first via hole V1 on the base substrate. Referring to FIG. 2 and FIG. 6, a part of at least one conductive line L1 is located directly above the first via hole V1. Referring to FIG. 2 and FIG. 6, the orthographic projection of at least one conductive line L1 on the base substrate partially overlaps with the orthographic projection of the recessed portion 1121 on the base substrate. Referring to FIG. 6, a part of at least one conductive line L1 is located directly above the recessed portion 1121. Referring to FIG. 2 and FIG. 6, the orthographic projection of at least one conductive line L1 on the base substrate partially overlaps with the orthographic projection of the bottom portion 112a of the recessed portion 1121 on the base substrate. Referring to FIG. 6, a part of at least one conductive line L1 is located directly above the bottom portion 112a of the recessed portion 1121. Referring to FIG. 2, at least one conductive line L1 spans the first via hole V1. Referring to FIG. 11A, the orthographic projection of the at least one conductive line L1 on the base substrate partially overlaps with the orthographic projection of the side portion 112b of the recessed portion 1121 on the base substrate, and a part of the at least one conductive line L1 is located directly above the side portion 112b of the recessed portion 1121.

Photoresist is a photosensitive material, and the photoresist includes positive photoresist and negative photoresist. The solubility of photoresist in the developing solution will be changed by the irradiation or radiation of ultraviolet light, electron beam, ion beam, X-ray, etc. For positive photoresist, the part irradiated by light is removed in the developing solution, while the unexposed part is retained. For negative photoresist, the part that is not irradiated by light is removed in the developing solution, while the exposed part is retained.

Forming the conductive line L1 by using negative photoresist can avoid the influence of light on the photoresist portion to be retained in the exposure process of forming the conductive line, avoid breakage or thinning of the conductive line, and avoid display defects of the display substrate. Forming the conductive line L1 by using negative photoresist means that, the negative photoresist is adopted in the exposure process of forming the conductive line L1, and the transparent conductive film F1 is etched with the photoresist pattern formed of negative photoresist as a mask, so as to form the conductive line L1. In the display substrate shown in FIG. 10C, the second planarization layer 122 does not include a light-shielding portion, and forming the conductive line by using negative photoresist can reduce or avoid breakage or thinning of the conductive line. However, in some other embodiments, a light-shielding portion can be formed in the second planarization layer 122, and on this basis, negative photoresist is used to form the conductive line; that is, the structure of the formed display substrate is as shown in FIG. 6, which effectively avoids breakage or thinning of the conductive line, and facilitates the formation of conductive lines with the same width.

For example, in the embodiments of the present disclosure, light 801, light 802, light 803 and light 811 can be selected as needed. For example, in some embodiments, the light 801 and the light 811 used in the exposure process, and the light 802 and the light 803 for forming light-shielding portions, are all ultraviolet light, but they are not limited thereto. For example, in some embodiments, the light used in the exposure process is ultraviolet light, and the light for forming the light-shielding portion is infrared light, but they are not limited thereto.

Figure 11B:
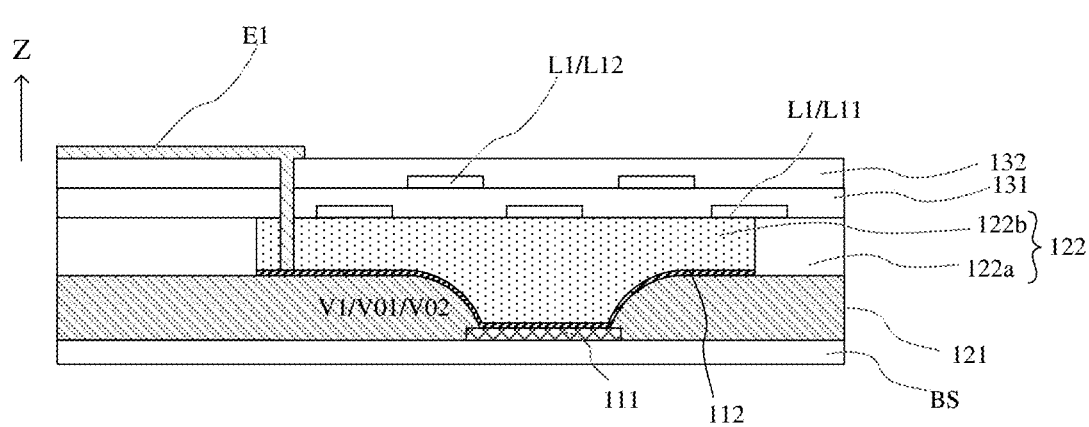
FIG. 11B is a schematic diagram of a display substrate provided by another embodiment of the present disclosure.

FIG. 11A is a schematic diagram of a display substrate provided by an embodiment of the present disclosure. FIG. 11B is a schematic diagram of a display substrate provided by another embodiment of the present disclosure. FIG. 11A and FIG. 11B show the conductive line L1. FIG. 11B shows the first electrode E1 of the first light-emitting element.

Figure 11C:
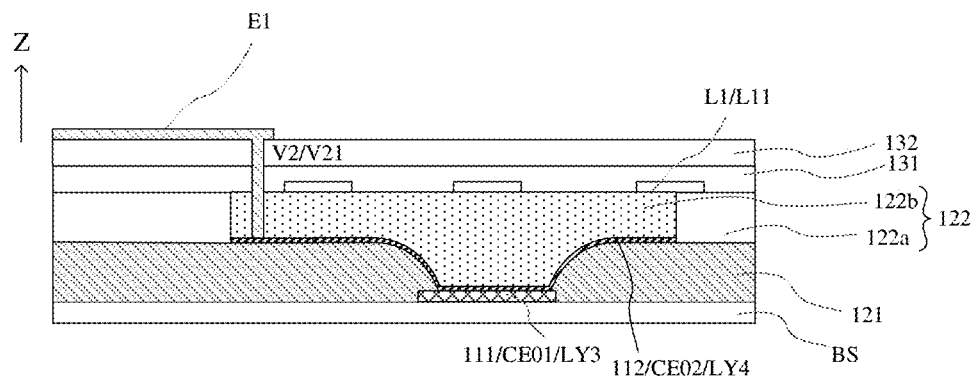
FIG. 11C is a schematic diagram illustrating a partial structure of a display substrate provided by an embodiment of the present disclosure.

FIG. 11C is a schematic diagram illustrating a partial structure of a display substrate provided by an embodiment of the present disclosure. As shown in FIG. 11C and FIG. 2, the first conductive element 111 includes the connection electrode CE01 shown in FIG. 2, and the second conductive element 112 includes the connection electrode CE02 shown in FIG. 2. The first electrode E1 of the light-emitting element of the first pixel unit is connected to the connection electrode CE02 through the via hole V21. That is, the light-shielding portion 122b of the second planarization layer 122 includes a part located directly above the connection electrode CE02.

Figure 11D:
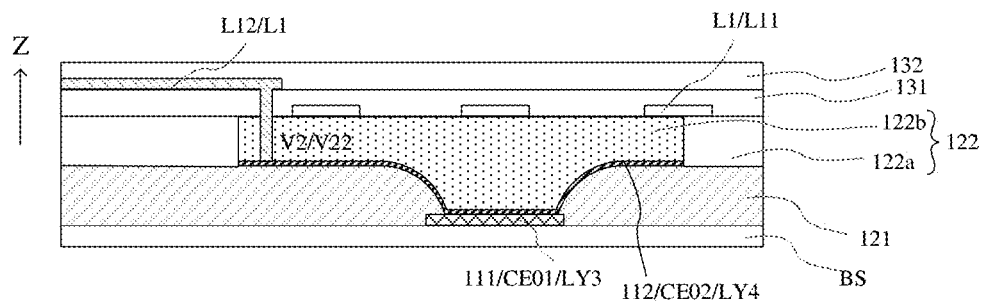
FIG. 11D is a schematic diagram illustrating a partial structure of a display substrate provided by an embodiment of the present disclosure.

FIG. 11D is a schematic diagram illustrating a partial structure of a display substrate provided by an embodiment of the present disclosure. As shown in FIG. 11D and FIG. 2, the first conductive element 111 includes the connection electrode CE01 shown in FIG. 2, and the second conductive element 112 includes the connection electrode CE02 shown in FIG. 2. The conductive line L1 is connected to the connection electrode CE02 through the via hole V22. That is, the light-shielding portion 122b of the second planarization layer 122 includes a part located directly above the connection electrode CE02.

For example, referring to FIG. 2, FIG. 11C and FIG. 11D, the first conductive element 111 and the connection electrode CE01 are located in a same layer, and the second conductive element 112 and the connection electrode CE02 are located in a same layer. In this case, the first conductive element 111 and the connection electrode CE01 are the same component, and the second conductive element 112 and the connection electrode CE02 are the same component; alternatively, the first conductive element 111 refers to a constant voltage line L0, and the second conductive element 112 refers to a shield electrode SE.

Figure 11E:
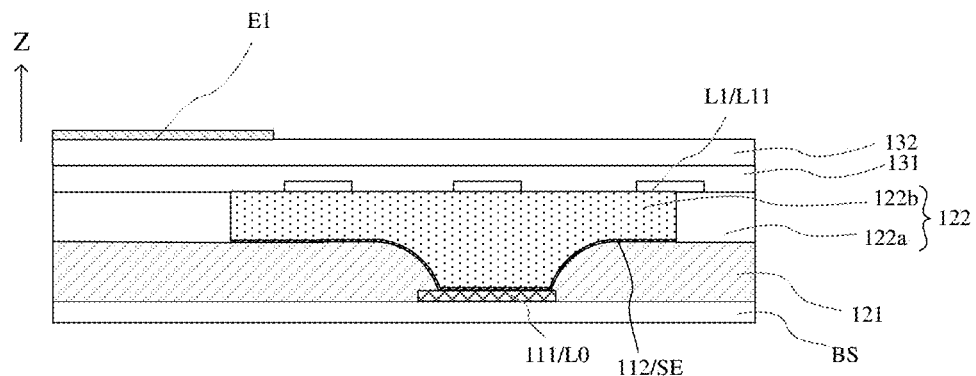
FIG. 11E is a schematic diagram illustrating a partial structure of a display substrate provided by an embodiment of the present disclosure.

FIG. 11E is a schematic diagram illustrating a partial structure of a display substrate provided by an embodiment of the present disclosure. As shown in FIG. 11E and FIG. 2, the first conductive element 111 includes the constant voltage line L0 shown in FIG. 2, and the second conductive element 112 includes the shield electrode SE shown in FIG. 2. That is, the light-shielding portion 122b of the second planarization layer 122 includes a part located directly above the shield electrode SE.

For example, referring to FIG. 2 and FIG. 11E, the first conductive element 111 and the constant voltage line L0 are located in a same layer, and the second conductive element 112 and the shield electrode SE are located in a same layer. In this case, the first conductive element III and the constant voltage line L0 are the same component, and the second conductive element 112 and the shield electrode SE are the same component; alternatively, the first conductive element III refers to the connection electrode CE01, and the second conductive element 112 refers to the connection electrode CE02.

Referring to FIG. 2 and FIGS. 11C-11E, the connection electrode CE02 and the shield electrode SE are located in the fourth conductive layer LY4, and the constant voltage line L0 and the connection electrode CE01 are located in the third conductive layer LY3.

Figure 11F:
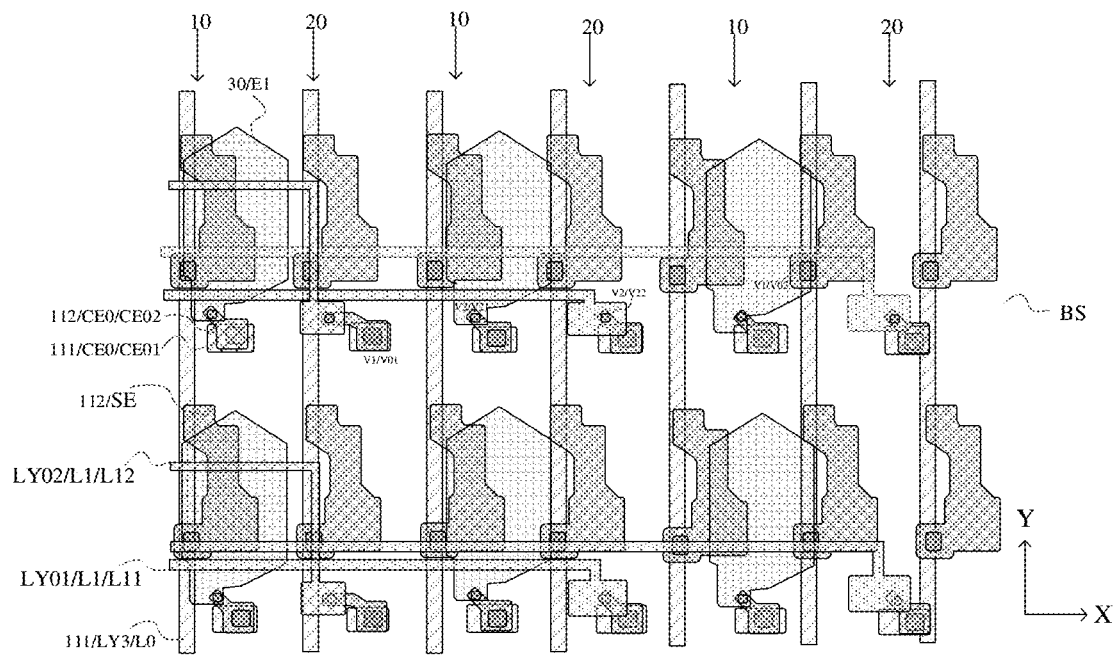
FIG. 11F is a schematic diagram illustrating a partial structure of a display substrate provided by an embodiment of the present disclosure.

FIG. 11F is a schematic diagram illustrating a partial structure of a display substrate provided by an embodiment of the present disclosure. For clarity, FIG. 11F merely shows the conductive line L1 connected to the connection element CE0, and does not show other conductive lines which can be referred to FIG. 2.

For example, in order to avoid breakage or thinning of the conductive line, the light-shielding portion 122b of the second planarization layer 122 in the display substrate includes a part located directly above the connection electrode CE02 or the shield electrode SE of the fourth conductive layer LY4. In some embodiments, the light-shielding portion 122b of the second planarization layer 122 in the display substrate includes a part located directly above the connection electrode CE02 and the shield electrode SE of the fourth conductive layer LY4. That is, the light-shielding portion 122b of the second planarization layer 122 in the display substrate includes a part located directly above at least one of the connection electrode CE02 and the shield electrode SE of the fourth conductive layer LY4.

For example, the second connection electrode is recessed at the via hole through which the second connection electrode and the first connection electrode are connected. For example, the second connection electrode has a recessed portion and a peripheral portion at the outer side of the recessed portion, the recessed portion of the second connection electrode has a bottom portion and a side portion, the bottom portion of the second connection electrode is connected to the peripheral portion of the second connection electrode through the side portion of the second connection electrode, and the light-shielding portion 122b of the second planarization layer 122 includes a part located directly above the second connection electrode. For example, the orthographic projection of the light-shielding portion 122b on the base substrate at least partially overlaps with the orthographic projection of the second connection electrode on the base substrate.

For example, the shield electrode is recessed at the via hole through which the shield electrode is connected to the constant voltage line, so that the shield electrode has a recessed portion and a peripheral portion at the outer side of the recessed portion, the recessed portion of the shield electrode has a bottom portion and a side portion, the bottom portion of the shield electrode is connected to the peripheral portion of the shield electrode through the side portion of the shield electrode, and the light-shielding portion 122b of the second planarization layer 122 includes a part located directly above the shield electrode. For example, the orthographic projection of the light-shielding portion 122b on the base substrate at least partially overlaps with the orthographic projection of the shield electrode on the base substrate.

Of course, in the display substrate provided by some embodiments of the present disclosure, the shield electrode SE may not be provided. In this case, the first conductive element 111 can be the connection electrode CE01, and the second conductive element 112 can be the connection electrode CE02.

In the display substrate provided by some embodiments of the present disclosure, the second conductive element 112 can also be other elements located in the fourth conductive layer LY4, which can be connected to the elements in the first conductive layer LY1, the second conductive layer LY2 or the third conductive layer LY3 through via holes. In this case, the light-shielding portion can also be located directly above the elements in the fourth conductive layer LY4 to avoid breakage or thinning of the conductive lines L1 spanning the via holes. FIGS. 11C-11E further show an insulating layer 131 and an insulating layer 132. The insulating layer 131 is provided between the second conductive line L12 and the first conductive line L11. The insulating layer 132 is provided between the second conductive line L12 and the first electrode E1 of the light-emitting element.

As shown in FIGS. 11C-11E, in some embodiments, the conductive line L1 is in contact with the upper surface of the second planarization layer 122, but is not limited thereto. For example, the upper surface of the second planarization layer 122 refers to the surface of the second planarization layer 122 facing away from the base substrate BS.

As shown in FIGS. 11C-11E, in some embodiments, the second conductive element 112 is in contact with the upper surface of the first planarization layer 121, but is not limited thereto. For example, the upper surface of the first planarization layer 121 refers to the surface of the first planarization layer 121 facing away from the base substrate BS.

Figure 11G:
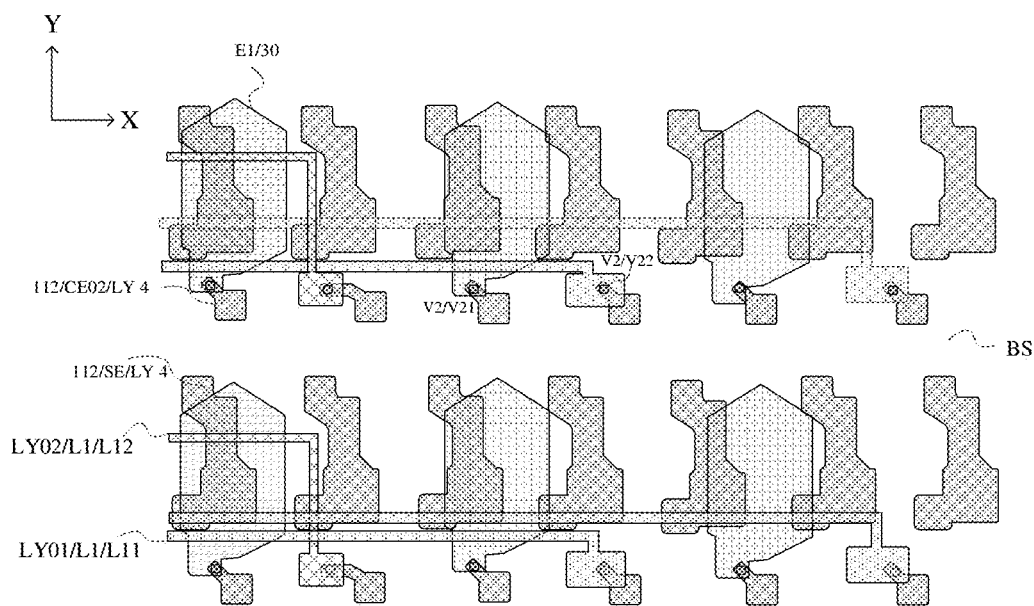
FIG. 11G is a schematic diagram illustrating a partial structure in a display substrate provided by an embodiment of the present disclosure.

FIG. 11G is a schematic diagram illustrating a partial structure in a display substrate provided by an embodiment of the present disclosure. For clarity, FIG. 11G shows part of the structure of FIG. 11F. FIG. 11G shows that the fourth conductive layer LY4 includes the connection electrode CE02 and the shield electrode SE.

Figure 11H:
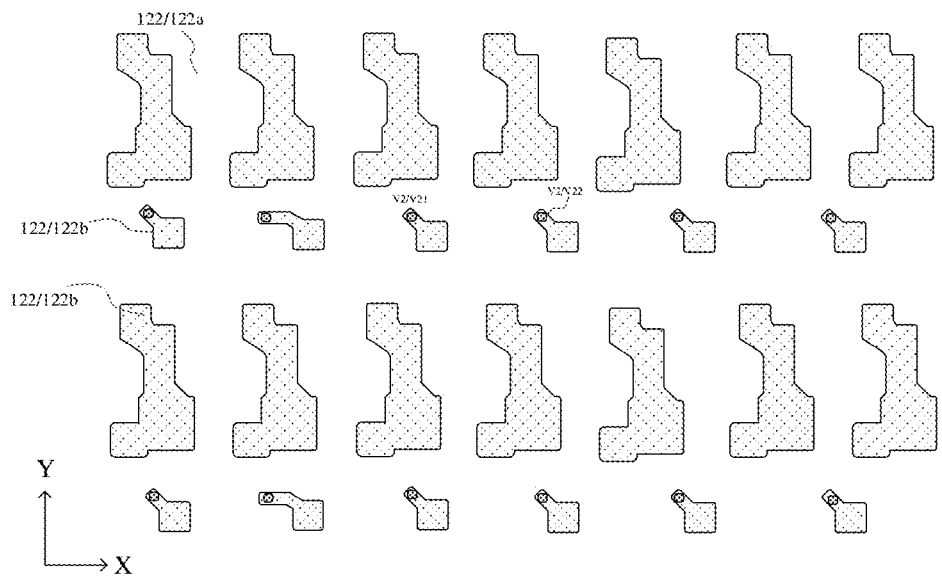
FIG. 11H is a schematic diagram of a second planarization layer and a second via hole penetrating through the second planarization layer in a display substrate provided by an embodiment of the disclosure.

FIG. 11H is a schematic diagram of a second planarization layer and a second via hole penetrating through the second planarization layer in a display substrate provided by an embodiment of the present disclosure. FIG. 11H shows a second via hole V2. As shown in FIG. 11H, the second planarization layer 122 includes a light-shielding portion 122b and a light-transmitting portion 122a. In FIG. 11H, the second planarization layer 122 includes the second via hole V2, the light-shielding portion 122b, and the light-transmitting portion 122a.

Figure 11I:
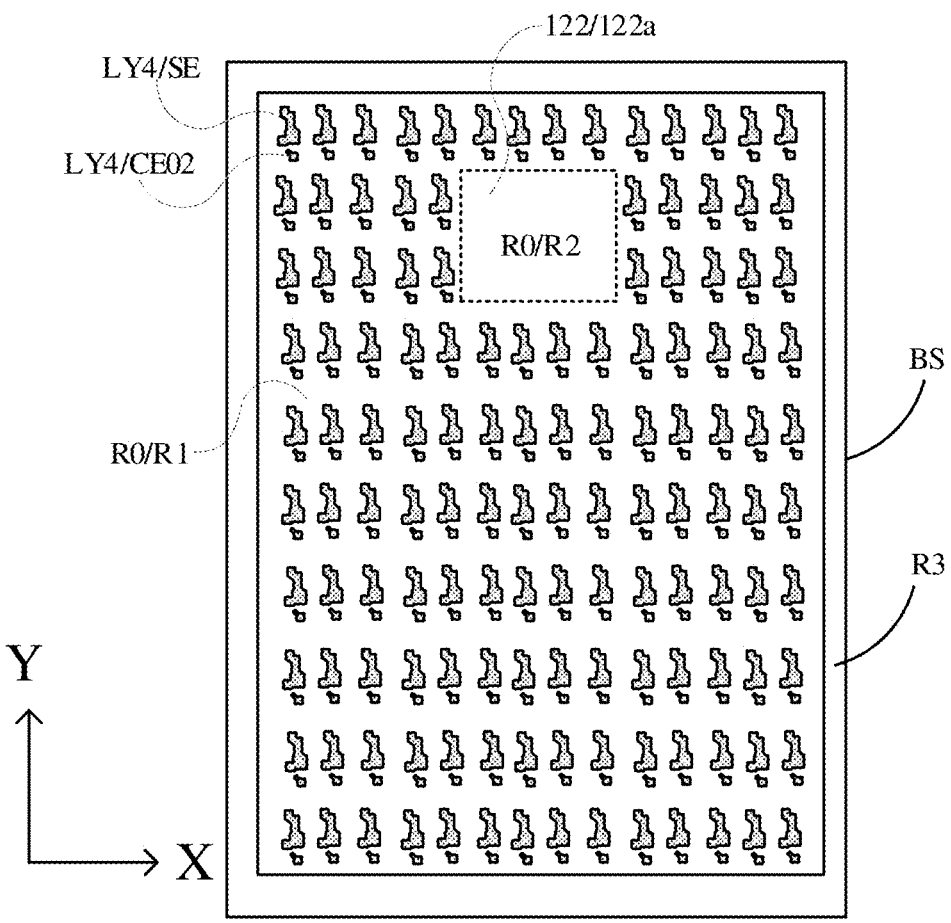
FIG. 11I is a schematic diagram illustrating a partial structure of a display substrate provided by an embodiment of the present disclosure.

FIG. 11I is a schematic diagram illustrating a partial structure of a display substrate provided by an embodiment of the present disclosure. As shown in FIG. 11I, the connection electrode CE02 and the shield electrode SE are both located in the first display region R1, but not in the second display region R2.

Figure 11J:
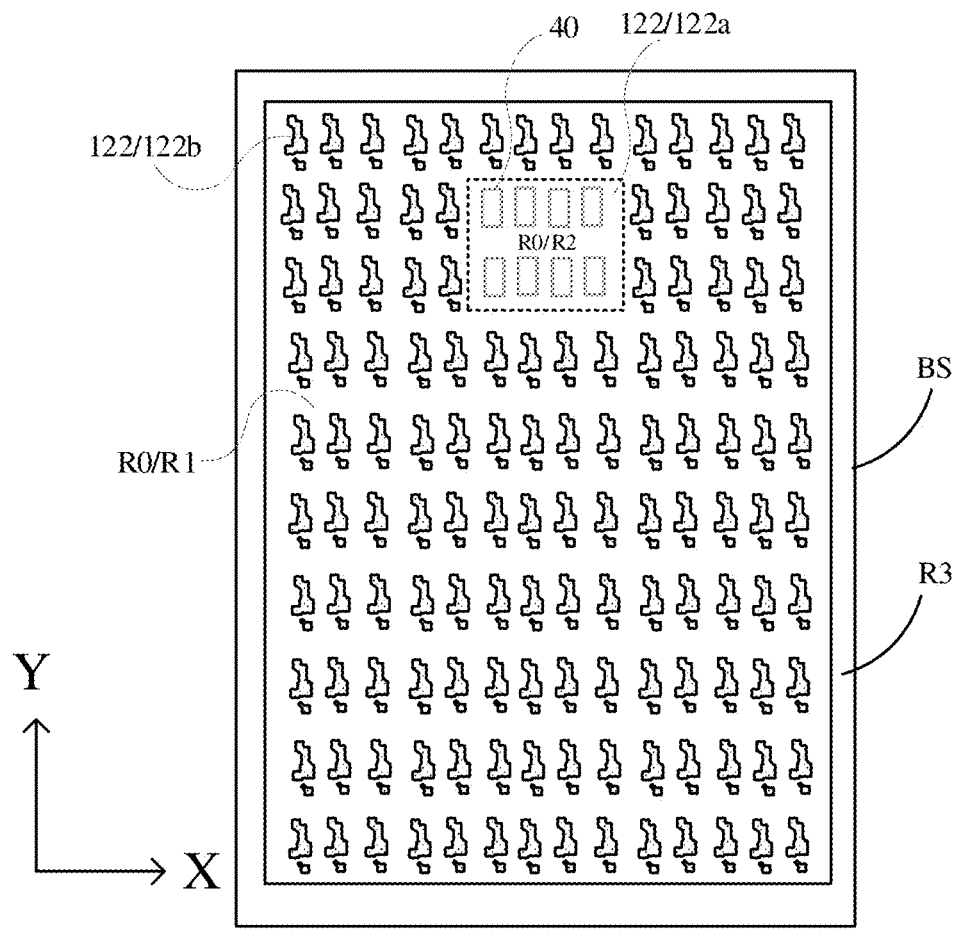
FIG. 11J is a schematic diagram illustrating a partial structure of a display substrate provided by an embodiment of the present disclosure.

FIG. 11J is a schematic diagram illustrating a partial structure of a display substrate provided by an embodiment of the present disclosure. As shown in FIG. 11J, the light-shielding portion 122b of the second planarization layer 122 is only located in the first display region R1, but not in the second display region R2, so that the arrangement of the light-shielding portion 122b does not affect the transmission of light through the second display region R2. As shown in FIG. 11J, the light-transmitting portion 122a of the second planarization layer 122 includes a part located in the first display region R1 and a part located in the second display region R2. As shown in FIG. 11J, the orthographic projection of the light-transmitting portion 122a of the second planarization layer 122 on the base substrate does not overlap with the orthographic projection of the second light-emitting element 40 on the base substrate. As shown in FIG. 11J, the orthographic projection of the light-shielding portion 122b on the base substrate does not overlap with the orthographic projection of the second light-emitting element 40 on the base substrate. As shown in FIG. 11J, the parts of the second planarization layer 122 located in the second display region R2 are all light-transmitting portions 122a. As shown in FIG. 11J, the parts of the second planarization layer 122 between adjacent light-shielding portions 122b in the first display region R1 are all light-transmitting portions 122a.

Referring to FIG. 11C and FIG. 11D, in some embodiments, the second via hole V2 penetrates through the light-shielding portion 122b, and of course, the embodiments of the present disclosure include but are not limited to this case. In some other embodiments, the second via hole V2 penetrates through the light-transmitting portion 122a.

Figure 11K:
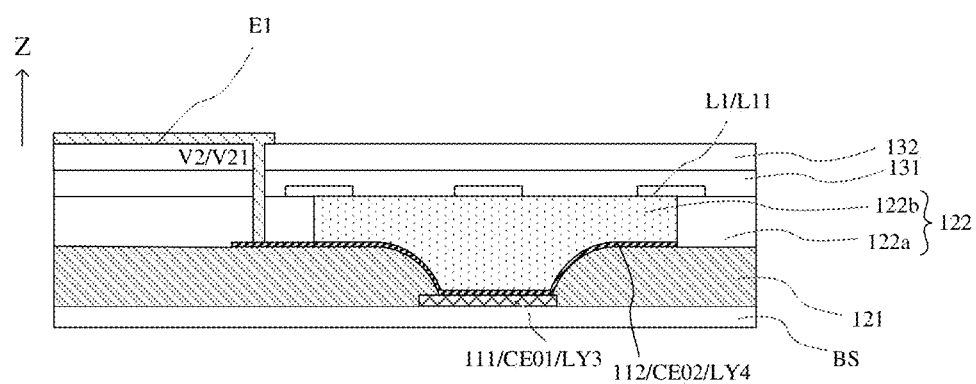
FIG. 11K is a cross-sectional view of a display substrate provided by an embodiment of the present disclosure.
Figure 11L:
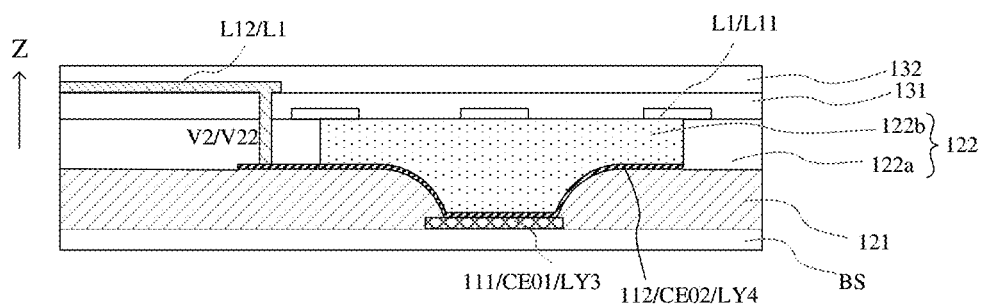
FIG. 11L is a cross-sectional view of a display substrate provided by another embodiment of the present disclosure.

FIG. 11K is a cross-sectional view of a display substrate provided by an embodiment of the present disclosure. FIG. 11L is a cross-sectional view of a display substrate provided by another embodiment of the present disclosure. As shown in FIG. 11K and FIG. 11L, the second via hole V2 penetrates through the light-transmitting portion 122a.

For example, referring to FIG. 1, the display substrate further includes a pixel unit 100, the pixel unit 100 includes a first pixel unit 101 and a second pixel unit 102, the pixel circuit 10 and the light-emitting element 30 of the first pixel unit 101 are both located in the first display region R1, the pixel circuit 20 of the second pixel unit 102 is located in the first display region R1, the light-emitting element 40 of the second pixel unit 102 is located in the second display region R2, and the pixel circuit 20 of the second pixel unit 102 is connected to the light-emitting element 40 of the second pixel unit 102 through the conductive line L1.

For example, referring to FIG. 1, the orthographic projection of the pixel circuit 10 of the first pixel unit 101 on the base substrate BS at least partially overlaps with the orthographic projection of the light-emitting element 30 of the first pixel unit 101 on the base substrate BS, and the orthographic projection of the pixel circuit 20 of the second pixel unit 102 on the base substrate BS does not overlap with the orthographic projection of the light-emitting element 40 of the second pixel unit 102 on the base substrate BS.

Referring to FIG. 2, the orthographic projection of the conductive line L1 on the base substrate BS partially overlaps with the orthographic projection of the pixel circuit 10 of the first pixel unit 101 on the base substrate BS. In FIG. 2, the position of the shield electrode can be regarded as the position of the pixel circuit.

For example, referring to FIG. 1, the display substrate further includes a connection element CE0, and the pixel circuit of the pixel unit 100 is connected to the conductive line L1 or the light-emitting element 30 of the first pixel unit 101 through the connection element CE0.

For example, referring to FIG. 1 and FIG. 2, the second conductive element 112 includes a portion of the connection element CE0 connected to the conductive line L1, or referring to FIG. 2, the second conductive element 112 includes a portion of the connection element CE0 connected to the light-emitting element 30 of the first pixel unit 101. For example, referring to FIG. 2, the connection element CE0 includes a connection electrode (first connection electrode) CE01 and a connection electrode (second connection electrode) CE02. The connection electrode CE01 and the connection electrode CE02 can be connected through a via hole penetrating through the insulating layer. For example, the material of the connection electrode CE01 includes a metal, and the material of the connection electrode CE02 includes a metal. For example, in some embodiments, the first conductive element 111 shown in FIG. 3 can be the connection electrode CE01 shown in FIG. 2, and the second conductive element 112 shown in FIG. 3 can be the connection electrode CE02 shown in FIG. 2. As shown in FIG. 2, the connection electrode CE02 is connected to the connection electrode CE01 through the via hole V01. For example, in some embodiments, the first conductive element 111 shown in FIG. 3 can be a constant voltage line L0, and the second conductive element 112 shown in FIG. 3 can be the shield electrode SE shown in FIG. 2. As shown in FIG. 3, the shield electrode SE is connected to the constant voltage line L0 through a via hole V02.

For example, referring to FIG. 2, a plurality of conductive lines L1 is provided, and the orthographic projection of at least one of the plurality of conductive lines L1 on the base substrate BS overlaps with the orthographic projection of the first via hole V1 on the base substrate BS.

The display substrates shown in FIG. 6, FIGS. 10A-10C, and FIGS. 11A-11E omit elements between the base substrate and the first conductive element. The display substrates shown in FIG. 11A and FIG. 11B show the structure of the second conductive element 112.

Figure 11M:
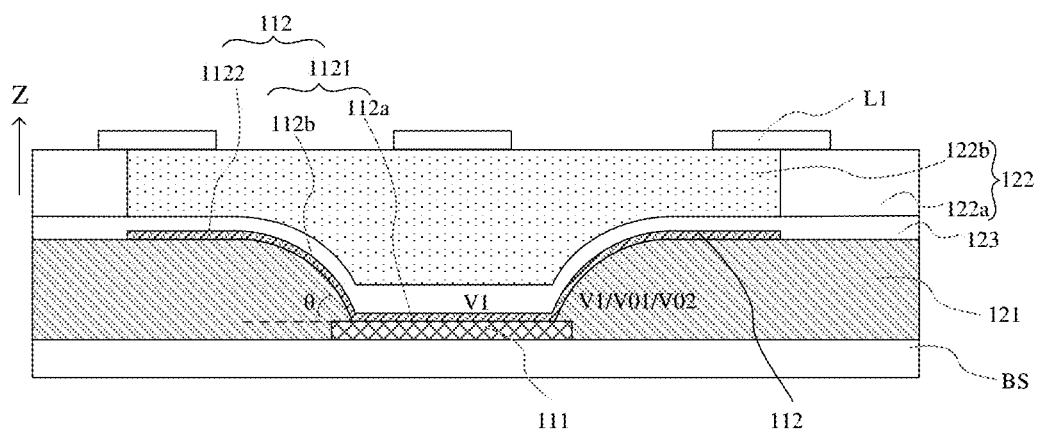
FIG. 11M is a cross-sectional view of a display substrate provided by another embodiment of the present disclosure.

FIG. 11M is a cross-sectional view of a display substrate provided by another embodiment of the present disclosure.

As shown in FIG. 11M, an insulating layer 123 is further provided between the second conductive element 112 and the second planarization layer 122. The material of the insulating layer 123 is different from the material of the second planarization layer 122. For example, the insulating layer 123 in FIG. 11M can be the fourth insulating layer ISL4 in FIG. 12C mentioned later.

For example, the via hole V01 and the via hole V02 are different via holes, and the via hole V21 and the via hole V22 are different via holes.

For example, in some embodiments of the present disclosure, after forming the light-shielding portion 122b, the conductive line L1 is formed. For example, in some embodiments of the present disclosure, the via hole V21 and the via hole V22 can be formed after the light-shielding portion 122b is formed, but it's not limited thereto. For example, in some embodiments of the present disclosure, the manufacturing method of the display substrate sequentially includes the following steps: forming the light-shielding portion 122b; forming the conductive line L1; forming the via hole penetrating through the second planarization layer; and forming the first electrode E1 of the light-emitting element.

Figure 12A:
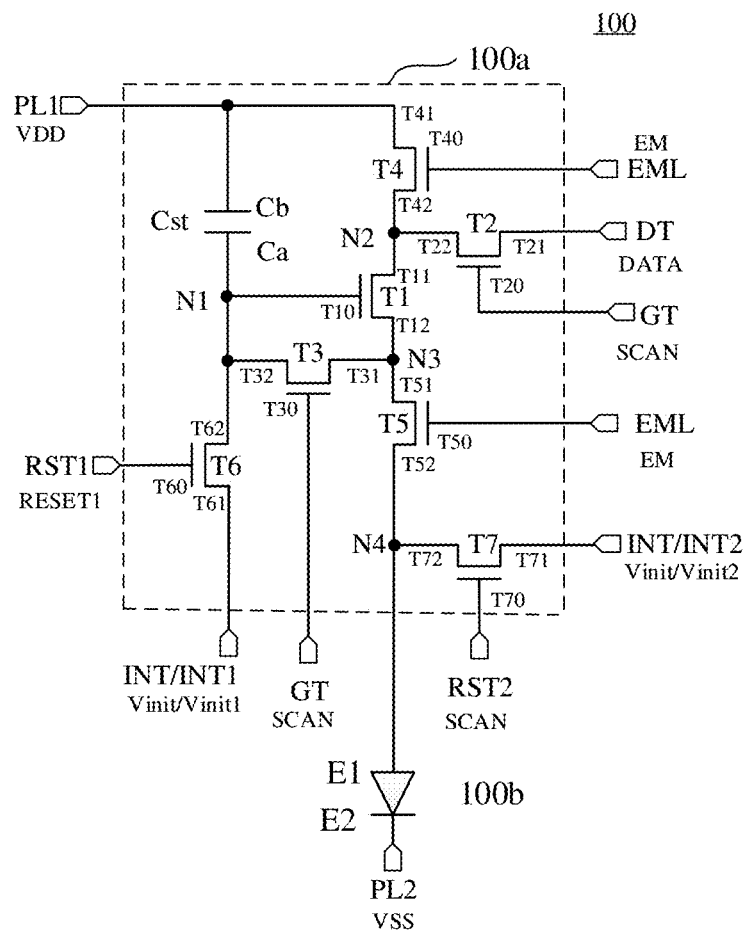
FIG. 12A is a schematic diagram of a pixel circuit in a display substrate provided by an embodiment of the present disclosure.
Figure 12B:
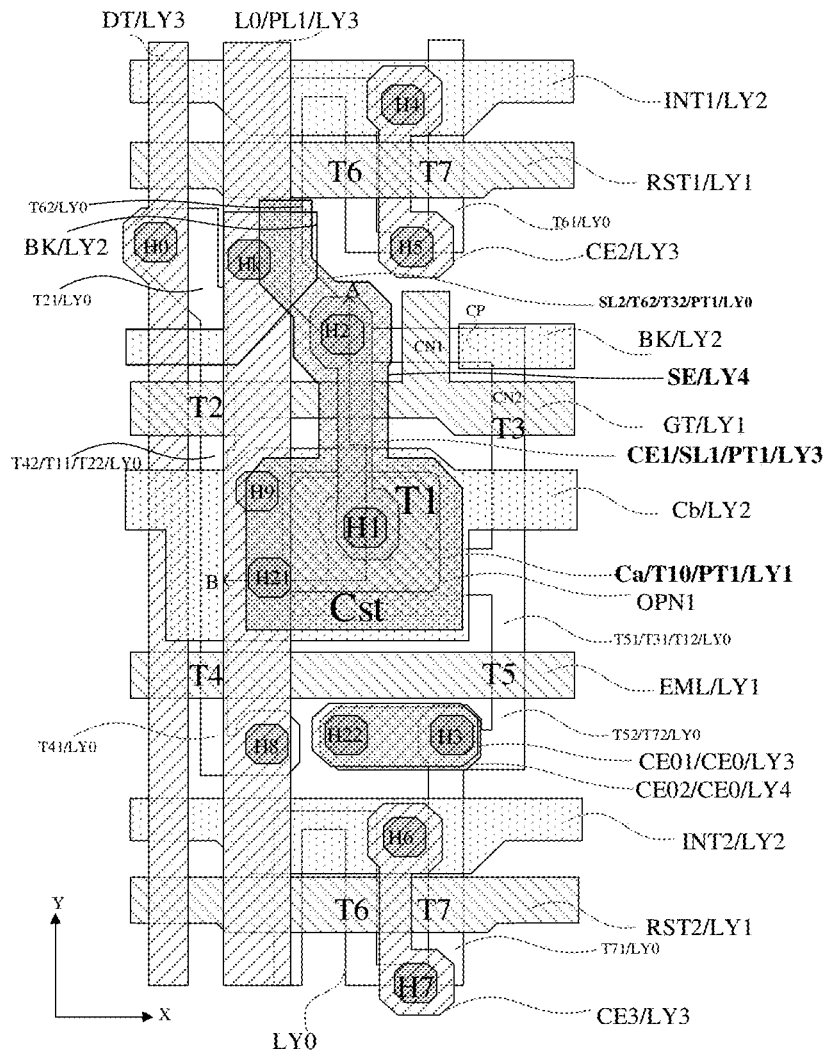
FIG. 12B is a layout diagram of a pixel circuit in a display substrate provided by an embodiment of the present disclosure.
Figure 12C:
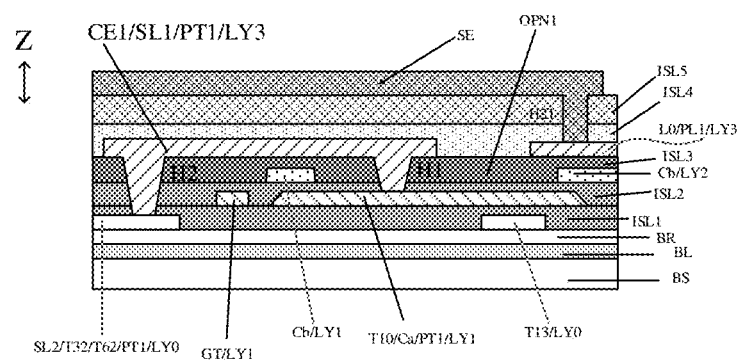
FIG. 12C is a cross-sectional view taken along line A-B of FIG. 12B.
Figure 12D:
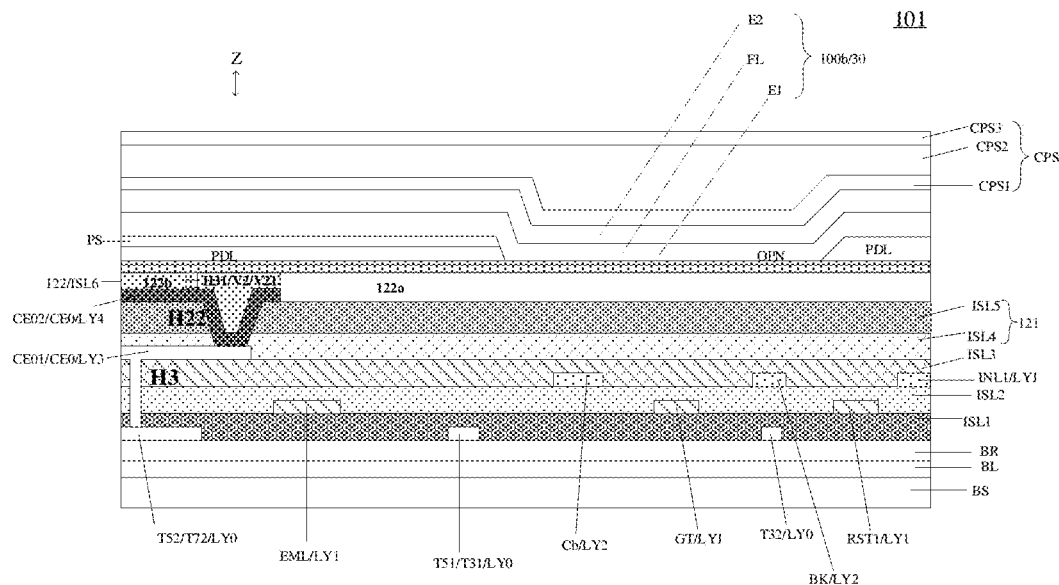
FIG. 12D is a cross-sectional view of a display substrate provided by an embodiment of the present disclosure.
Figure 12E:
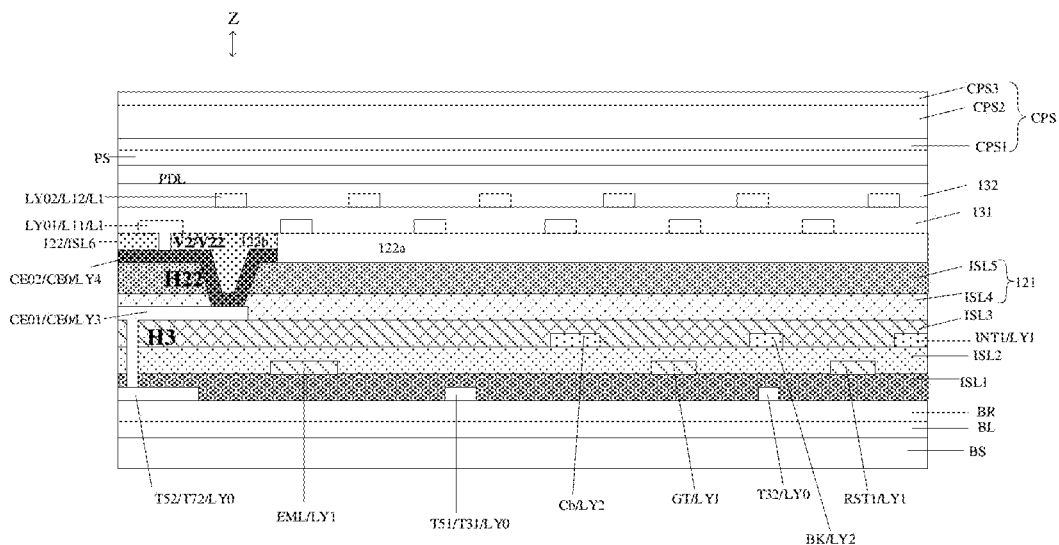
FIG. 12E is a cross-sectional view of a display substrate provided by an embodiment of the present disclosure.

FIG. 12A is a schematic diagram of a pixel circuit in a display substrate provided by an embodiment of the present disclosure. FIG. 12B is a layout diagram of a pixel circuit in a display substrate provided by an embodiment of the present disclosure. FIG. 12C is a cross-sectional view taken along line A-B of FIG. 12B. FIG. 12D is a cross-sectional view of a display substrate provided by an embodiment of the present disclosure. FIG. 12E is a cross-sectional view of a display substrate provided by an embodiment of the present disclosure.

The pixel circuit shown in FIG. 12A can be a pixel circuit of a low temperature poly-silicon (LTPS) AMOLED.

FIG. 12A shows a pixel circuit of one pixel unit of a display substrate. As shown in FIG. 12A, the pixel unit 100 includes a pixel circuit 100a and a light-emitting element 100b, and the pixel circuit 100a is configured to drive the light-emitting element 100b. For example, the pixel circuit 100a is configured to provide a driving current to drive the light-emitting element 100b to emit light. For example, the light-emitting element 100b is an organic light-emitting diode (OLED), and the light-emitting element 100b emits red light, green light, blue light or white light, etc., under the drive of the corresponding pixel circuit 100a. The color of the light emitted by the light-emitting element 100b can be determined according to needs. The pixel circuit 100a includes the first pixel circuit 10 or the second pixel circuit 20 described above. The light-emitting element 100b includes the first light-emitting element 30 or the second light-emitting element 40 described above.

As shown in FIG. 12A and FIG. 12B, the pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1 and a second electrode E2, and a light-emitting functional layer located between the first electrode E1 and the second electrode E2. For example, the first electrode E1 is an anode, and the second electrode E2 is a cathode. Generally, the threshold compensation transistor T3 and the first reset transistor T6 reduce the leakage current by adopting double-gate thin film transistors (TFT).

As shown in FIG. 12A and FIG. 12B, the display substrate includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. For example, in a row of pixel units, the second reset control signal line RST2 can be connected to the gate line GT, so as to be input with the scan signal SCAN. Of course, the second reset control signal line RST2 can also be inputted with a second reset control signal RESET2. The first initialization signal line INT1 is configured to provide a first initialization signal Vinit to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes can be between the first voltage signal VDD and the second voltage signal VSS, but are not limited thereto. For example, the first initialization signal Vinit1 and the second initialization signal Vinit2 can be both smaller than or equal to the second voltage signal VSS. For example, in some embodiments, the first initialization signal line INT1 and the second initialization signal line INT2 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are the same, and both of which are Vinit.

As shown in FIG. 12A and FIG. 12B, the driving transistor T1 is electrically connected to the light-emitting element 100b, and outputs a driving current to drive the light-emitting element 100b to emit light, under the control of the scan signal SCAN, the data signal DATA, the first voltage signal VDD and the second voltage signal VSS, etc.

For example, the light-emitting element 100b includes an organic light-emitting diode (OLED), and the light-emitting element 100b emits red light, green light, blue light or white light, etc., under the drive of the corresponding pixel circuit 100a. For example, one pixel includes a plurality of pixel units. One pixel can include a plurality of pixel units that emit light of different colors. For example, one pixel includes a pixel unit that emits red light, a pixel unit that emits green light, and a pixel unit that emits blue light, but it is not limited thereto. The number of the pixel units included in one pixel and the light-emitting condition of each pixel unit can be determined according to needs.

For example, as shown in FIG. 12A and FIG. 12B, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as shown in FIG. 12A and FIG. 12B, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as shown in FIG. 12A and FIG. 12B, a gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistor T5 is connected to a first electrode E1 of the light-emitting element 100b.

As shown in FIG. 12A and FIG. 12B, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. For example, the first initialization signal line INT1 and the second initialization signal line INT2 are connected to each other and are inputted with the same initialization signal, but it is not limited to this case. In some embodiments, the first initialization signal line INT1 and the second initialization signal line INT2 can also be insulated from each other and configured to input signals, respectively.

For example, as shown in FIG. 12A and FIG. 12B, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100b. For example, as shown in FIG. 12A, a gate electrode T60 of the first reset transistor T6 is connected to the first reset control signal line RST1, and a gate electrode T70 of the second reset transistor T7 is connected to the second reset control signal line RST2.

As shown in FIG. 12A, the first power supply line PL1 is configured to provide the first voltage signal VDD to the pixel circuit 100a. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as shown in FIG. 12A, the second power supply line PL2 is connected to the second electrode E2 of the light-emitting element 100b.

FIG. 12A shows a first node N1, a second node N2, a third node N3 and a fourth node N4. For example, in some embodiments, referring to FIG. 12A, a capacitor is formed between the first node N1 and the conductive line L1, and a capacitor is formed between the conductive line L1 and the fourth node N4, that is, the conductive line L1 is coupled with the first node N1 and the fourth node N4, respectively, resulting in brightness differences and display defects (for example, forming stripes (Mura)), which affects the display quality.

As shown in FIG. 12B, the driving transistor T1 includes a gate electrode T10. Referring to FIG. 12B and FIG. 12C, the second electrode Cb of the storage capacitor Cst has an opening OPN1, and one end of the connection electrode CE1 is connected to the gate electrode T10 of the driving transistor T1 through the opening OPN1. The connection electrode CE1 can also be referred to as a first gate signal line SL1. As shown in FIG. 12B, the first gate signal line SL1 is connected to the gate electrode T10 of the driving transistor T1.

As shown in FIG. 12B, the first gate signal line SL1 is connected to the second gate signal line SL2. The gate electrode T10 of the driving transistor T1, the first gate signal line SL1, and the second gate signal line SL2 form a gate signal portion PT1. The potentials on the components of the gate signal portion PT1 are the same. Of course, in some other embodiments, the second gate signal line SL2 may not be provided, and in this case, the gate electrode T10 of the driving transistor T1 and the first gate signal line SL1 form the gate signal portion PT1. For example, the second gate signal line SL2 is the second electrode T62 of the first reset transistor T6.

Referring to FIG. 12B and FIG. 12C, in order to stabilize the potentials on the gate signal portion PT1, the display substrate provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and the shield electrode SE can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS. As shown in FIG. 12C, the shield electrode SE is connected to the constant voltage line L0 through a via hole H21. As shown in FIG. 12C, the via hole H21 penetrates through the fourth insulating layer ISL4 and the fifth insulating layer ISL5. For example, the via hole H21 can correspond to the first via hole V1 described above.

Referring to FIG. 12B, in order to make the shield electrode play a better shielding role and increase the shielding effect, the orthographic projection of the first gate signal line SL1 on the base substrate BS completely falls within the orthographic projection of the shield electrode SE on the base substrate BS.

For example, in order to reduce display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 µm. Because the area occupied by the pixel unit is limited, the distance of the shield electrode SE extending beyond the first gate signal line SL1 can be restricted. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 µm.

As shown in FIG. 12B, the display substrate further includes a block BK, and the block BK is connected to the first power supply line PL1. The threshold compensation transistor T3 includes a first channel CN1 and a second channel CN2, and the first channel CN1 and the second channel CN2 are connected through a conductive connection portion CP. The orthographic projection of the block BK on the base substrate BS at least partially overlaps with the orthographic projection of the conductive connection portion CP of the threshold compensation transistor T3 on the base substrate BS. As shown in FIG. 12B, the conductive connection portion CP of the threshold compensation transistor T3 of the pixel unit in the present column is shielded by the block BK of the pixel unit in the adjacent column.

For example, as shown in FIG. 12B, in the case where the display substrate includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. Further, for example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 µm. For example, the boundary of the orthographic projection of the block BK on the base substrate BS exceeds the boundary of the orthographic projection of the second gate signal line SL2 on the base substrate BS by a distance greater than or equal to 2.33 µm. Of course, in some other embodiments, the shield electrode SE can also be used to replace the block BK, or the orthographic projection of the second gate signal line SL2 on the base substrate BS not only falls within the orthographic projection of the block BK on the base substrate BS, but also falls within the orthographic projection of the shield electrode SE on the base substrate BS.

For example, the material of the first gate signal line SL1 is different from the material of the second gate signal line SL2. For example, the material of the first gate signal line SL1 includes a metal, and the material of the second gate signal line SL2 includes a conductive material formed by conducting a semiconductor material.

For example, as shown in FIG. 12B, in order to save wirings, the first power supply line PL1 serves as the constant voltage line L0. In some other embodiments, in order to save wirings, the first initialization signal line INT1 can also be used as the constant voltage line or the second initialization signal line INT2 can also be used as the constant voltage line. Examples of the constant voltage line L0 are not limited to the first power supply line PL1, the first initialization signal line INT1, and the second initialization signal line INT2, and any signal line that provides a constant voltage in the pixel circuit can be used as the constant voltage line L0. The embodiment of the present disclosure is illustrated with reference to the case where the first power supply line PL1 serves as the constant voltage line L0 by way of example; in the case where a signal line that provides a constant voltage other than the first power supply line PL1 is used as the constant voltage line L0, the shape of the shield electrode SE can be adjusted so that it is connected to the signal line that provides the constant voltage.

For example, in some embodiments, the pixel unit includes a pixel circuit and a light-emitting element, the pixel circuit is configured to drive the light-emitting element, the pixel circuit includes a driving transistor, and the driving transistor includes a gate electrode. The display substrate further includes: a first gate signal line, connected to the gate electrode of the driving transistor; a constant voltage line, configured to provide a first constant voltage to the pixel circuit; and a shield electrode, connected to the constant voltage line, wherein the orthographic projection of the first gate signal line on the base substrate BS falls within the orthographic projection of the shield electrode SE on the base substrate BS. For example, the second conductive element 112 includes a portion of the shield electrode SE connected to the constant voltage line L0.

For example, the orthographic projection of the conductive line L1 on the base substrate BS partially overlaps with the orthographic projection of the pixel circuit (the first pixel circuit 10) of the first pixel unit 101 on the base substrate BS. For example, the shield electrode SE is located between the conductive line L1 and the first gate signal line SL1. In the embodiment of the present disclosure, after the pixel circuit is formed, the shield electrode SE is formed, then the conductive line L1 is formed, and then the light-emitting element is formed, so that the shield electrode SE is located between the conductive line L1 and the first gate signal line SL1, and the shield electrode SE is located between the conductive line L1 and the gate electrode T10 of the driving transistor.

For example, the orthographic protection of the conductive line L1 on the base substrate BS partially overlaps with the orthographic projection of the first gate signal line SL1 in the pixel circuit of the first pixel unit 101 on the base substrate BS.

Referring to FIG. 12C and FIG. 12D, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connection electrode CE01, and the connection electrode CE01 is connected to the second electrode T52 of the second light-emitting control transistor T5 through a via hole H3 penetrating through the first insulating layer ISL1, the second insulating layer ISL2, and the third insulating layer ISL3. A fourth insulating layer ISL4 and a fifth insulating layer ISL5 are disposed on the third conductive layer LY3, and a fourth conductive layer LY4 is disposed on the fourth insulating layer ISL4 and the fifth insulating layer ISL5. The fourth conductive layer LY4 includes a connection electrode CE02, and the connection electrode CE02 is connected to the connection electrode CE01 through a via hole H22 penetrating through the fourth insulating layer ISL4 and the fifth insulating layer ISL5. A sixth insulating layer ISL6 is disposed on the fourth conductive layer LY4, and the light-emitting element 100b (the first light-emitting element 30) is connected to the connection electrode CE02 through a via hole penetrating through the sixth insulating layer ISL6. The light-emitting element 100b includes a first electrode E1, a second electrode E2, and a light-emitting functional layer FL located between the first electrode E1 and the second electrode E2. For example, the connection element CE0 includes the connection electrode CE01 and the connection electrode CE02. The via hole H22 can correspond to the first via hole V1 described above.

As shown in FIG. 12B, one end of the connection electrode CE1 is connected to the gate electrode T10 of the driving transistor T1 through a via hole H1, and the other end of the connection electrode CE1 is connected to the second electrode T62 of the first reset transistor T6 through a via hole H2. One end of the connection electrode CE2 is connected to the first initialization signal line INT1 through a via hole H4, and the other end of the connection electrode CE2 is connected to the first electrode T61 of the first reset transistor T6 through a via hole H5. One end of the connection electrode CE3 is connected to the second initialization signal line INT2 through a via hole H6, and the other end of the connection electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display substrate, a self-aligned process is adopted, and a semiconductor patterned layer is subjected to a conducting process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, so as to form a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7. The portion of the semiconductor pattern layer covered by the first conductive layer LY1 retains semiconductor characteristics, so as to form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as shown in FIG. 12B, the second electrode T72 of the second reset transistor T7 and the second electrode T52 of the second light-emitting control transistor T5 are formed integrally; the first electrode T51 of the second light-emitting control transistor T5, the second electrode T12 of the driving transistor T1, and the first electrode T31 of the threshold compensation transistor T3 are formed integrally; the first electrode T11 of the driving transistor T1, the second electrode T22 of the data writing transistor T2, and the second electrode T42 of the first light-emitting control transistor T4 are formed integrally; and the second electrode T32 of the threshold compensation transistor T3 and the second electrode T62 of the first reset transistor T6 are formed integrally. In some embodiments, as shown in FIG. 12B, the first electrode T71 of the second reset transistor T7 and the first electrode T61 of the first reset transistor T6 can be formed integrally.

For example, the channel regions of the transistors used in the embodiment of the present disclosure can adopt monocrystalline silicon, polycrystalline silicon (such as low temperature poly-silicon), or metal oxide semiconductor materials (such as IGZO, AZO, etc.). In one embodiment, the transistors are all P-type low temperature poly-silicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is a metal oxide semiconductor material (such as IGZO, AZO, etc.). The metal oxide semiconductor thin film transistor has a lower leakage current, which facilitates reducing the leakage current of the gate electrode of the driving transistor T1.

For example, the transistors adopted in the embodiments of the present disclosure can include various structures, such as a top gate structure, a bottom gate structure, or a dual-gate structure. In one embodiment, the threshold compensation transistor T3 and the first reset transistor T6, that are directly connected to the gate electrode of the driving transistor T1, are dual-gate thin film transistors, which can facilitate reducing the leakage current of the gate electrode of the driving transistor T1.

For example, as shown in FIG. 12D, the display substrate further includes a pixel definition layer PDL and a spacer PS. The pixel definition layer has an opening OPN, and the opening of the pixel definition layer is configured to define the light-emitting area (light-emitting region, effective light-emitting area) of the pixel unit. The spacer is configured to support a fine metal mask when forming the light-emitting functional layer.

As shown in FIG. 12D, the light-emitting element 100b (the first light-emitting element 30) is connected to the connection electrode CE02 through a via hole H31 (via hole V22) penetrating through the sixth insulating layer ISL6. The light-emitting element 100b includes a first electrode E1, a second electrode E2, and a light-emitting functional layer FL located between the first electrode E1 and the second electrode E2. FIG. 12D shows a first pixel unit 101.

For example, the opening of the pixel definition layer is the light-exiting region of the pixel unit. The light-emitting functional layer is located on the first electrode E1 of the light-emitting element 100b, and the second electrode E2 of the light-emitting element 100b is located on the light-emitting functional layer. For example, an encapsulation layer CPS is disposed on the light-emitting element 100b. The encapsulation layer CPS includes a first encapsulation layer CPS1, a second encapsulation layer CPS2 and a third encapsulation layer CPS3. For example, the first encapsulation layer CPS1 and the third encapsulation layer CPS3 are inorganic material layers, and the second encapsulation layer CPS2 is an organic material layer. For example, the first electrode E1 is the anode of the light-emitting element 100b, and the second electrode E2 is the cathode of the light-emitting element 100b, but it is not limited to this case.

As shown in FIG. 12E, one conductive line L1 is connected to the connection element CE0 through a via hole V22 penetrating through the sixth insulating layer ISL6. The remaining conductive lines shown in FIG. 12E are not connected to the connection element CE0, and the remaining conductive lines shown in FIG. 12E pass through the second pixel circuit 20. FIG. 12E shows a first conductive line L11 located in the first transparent conductive layer LY01 and a second conductive line L12 located in the second transparent conductive layer LY02. FIG. 12E shows an insulating layer 131 and an insulating layer 132. As shown in FIG. 12E, the orthographic projection of one conductive line L1 on the base substrate BS partially overlaps with the orthographic projection of the connection electrode CE02 which can serve as the second conductive element on the base substrate BS.

For example, as shown in FIG. 12B, the orthographic projection of the gate electrode T10 of the driving transistor T1 on the base substrate BS falls within the orthographic projection of the shield electrode SE on the base substrate BS.

For example, as shown in FIG. 12B, in the case where the display substrate includes the second gate signal line SL2, the second gate signal line SL2 is connected to the first gate signal line SL1, and the orthographic projection of the second gate signal line SL2 on the base substrate BS also falls within the orthographic projection of the shield electrode SE on the base substrate BS. Further, for example, the boundary of the orthographic projection of the shield electrode SE on the base substrate BS exceeds the boundary of the orthographic projection of the second gate signal line SL2 on the base substrate BS. For example, the boundary of the orthographic projection of the shield electrode SE on the base substrate BS exceeds the boundary of the orthographic projection of the second gate signal line SL2 on the base substrate BS by a distance greater than or equal to 1.75 μm. For example, the boundary of the orthographic projection of the shield electrode SE on the base substrate BS exceeds the boundary of the orthographic projection of the second gate signal line SL2 on the base substrate BS by a distance greater than or equal to 2.33 μm.

For example, as shown in FIG. 12B, the orthographic projections of the gate electrode T10 of the driving transistor T1, the first gate signal line SL1, and the second gate signal line SL2 on the base substrate BS all fall within the orthographic projection of the shield electrode SE on the base substrate BS.

For example, as shown in FIG. 12B, the orthographic projection of the shield electrode SE on the base substrate BS partially overlaps with the orthographic projection of the second gate signal line SL2 on the base substrate BS, and the orthographic projection of the block BK on the base substrate BS partially overlaps with the orthographic projection of the second gate signal line SL2 on the base substrate BS. Thus, in the display substrate shown in FIG. 12B, the shield electrode SE and the block BK form a double-layer shield for the second gate signal line SL2.

For example, as shown in FIG. 12B, the orthographic projection of the shield electrode SE on the base substrate BS partially overlaps with the orthographic projection of the block BK on the base substrate BS.

Of course, in some other embodiments, the block BK may not be provided, or the orthographic projection of the block BK on the base substrate BS does not overlap with the orthographic projection of the second gate signal line SL2 on the base substrate BS.

For example, as shown in FIG. 12B, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in some other embodiments, the block BK may not be provided, or the orthographic projection of the block BK on the base substrate BS does not overlap with the orthographic projection of the second gate signal line SL2 on the base substrate BS.

For example, as shown in FIG. 12B, two blocks BK are shown, the block BK at the left side extends to a pixel unit (not shown) at the left side of the pixel unit shown in the figure, so as to shield the conductive connection portion CP of the threshold compensation transistor T3 of the pixel unit at the left side of the pixel unit shown in the figure, while the block BK at the right side is extended from the block BK connected to a pixel unit (not shown) at the right side of the pixel unit shown in the figure.

As shown in FIG. 12B, the channel of each transistor, as well as the first electrode and the second electrode at both sides of the channel, are located in the active layer LY0; the first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1; the first initialization signal line INT1, the second electrode Cb of the storage capacitor Cst, and the second initialization signal line INT2 are located in the second conductive layer LY2; the data line DT, the first power supply line PL1, the connection electrode CE1, the connection electrode CE2, the connection electrode CE3, and the connection electrode CE01 are located in the third conductive layer LY3; and the shield electrode SE is located in the fourth conductive layer LY4.

As shown in FIG. 12B, the first initialization signal line INT1, the first reset control signal line RST1, the gate line GT, the light-emitting control signal line EML, the second initialization signal line INT2, and the second reset control signal lines RST2 all extend along the first direction X; and as shown in FIG. 12B, the data line DT and the first power supply line PL1 both extend along the second direction Y.

In the embodiments of the present disclosure, an orthographic projection of an element A on the base substrate BS falling within an orthographic projection of an element B on the base substrate BS means that the orthographic projection of the element A on the base substrate BS completely falls within the orthographic projection of the element B on the base substrate BS, that is, the orthographic projection of the element B on the base substrate BS covers the orthographic projection of the element A on the base substrate BS, and the area of the orthographic projection of the element A on the base substrate BS is smaller than or equal to the area of the orthographic projection of the element B on the base substrate BS.

For example, in some embodiments of the present disclosure, each pixel circuit 100a is provided with the shield electrode SE as described above. That is, both the first pixel circuit 10 of the first pixel unit 101 and the second pixel circuit 20 of the second pixel unit 102 are provided with the shield electrode SE as described above. But it is not limited to this case. For example, in some other embodiments, no shield electrode SE is provided in any pixel circuit 100a.

For example, the transistors in the pixel circuit of the embodiment of the present disclosure are all thin film transistors. For example, the first conductive layer LY1, the second conductive layer LY2, the third conductive layer LY3 and the fourth conductive layer LY4 are all made of metal materials. For example, the first conductive layer LY1 and the second conductive layer LY2 are formed of metal materials such as nickel, aluminum, etc., but are not limited thereto. For example, the third conductive layer LY3 and the fourth conductive layer LY4 are formed of materials such as titanium, molybdenum, aluminum, etc., but are not limited thereto. For example, the third conductive layer LY3 and the fourth conductive layer LY4 are respectively a structure formed by three sub-layers of Ti/Al/Ti, but are not limited thereto. For example, the base substrate can be a glass substrate or a polyimide substrate, but it is not limited thereto, and can be selected as needed. For example, in the embodiment of the present disclosure, the thickness of the fifth insulating layer ISL5 is greater than the thickness of at least one of the fourth insulating layer ISL4, the third insulating layer ISL3, the second insulating layer ISL2 and the first insulating layer ISL1. In some embodiments, the thickness of the fifth insulating layer ISL5 is greater than the thickness of each of the fourth insulating layer ISL4, the third insulating layer ISL3, the second insulating layer ISL2 and the first insulating layer ISL1. For example, the buffer layer BL, the isolation layer BR, the first insulating layer ISL1, the second insulating layer ISL2, the third insulating layer ISL3, the fourth insulating layer ISL4, the fifth insulating layer ISL5, the sixth insulating layer ISL6, the insulating layer 131 and the insulating layer 132 are all made of insulating materials. For example, the buffer layer BL, the isolation layer BR, the first insulating layer ISL1, the second insulating layer ISL2, the third insulating layer ISL3, the fourth insulating layer ISL4 and the fifth insulating layer ISL5 are all made of insulating materials. At least one of the buffer layer BL, the isolation layer BR, the first insulating layer ISL1, the second insulating layer ISL2, the third insulating layer ISL3 and the fourth insulating layer ISL4 is made of an inorganic insulating material, and the base material of the fifth insulating layer ISL5 can include an organic material. For example, the inorganic insulating material includes at least one of silicon oxide, silicon nitride and silicon oxynitride, but is not limited thereto. For example, the organic material includes resin, but is not limited thereto. The materials of the first electrode E1 and the second electrode E2 of the light-emitting element can be selected as needed. In some embodiments, the first electrode E1 can adopt at least one of transparent conductive metal oxide and silver, but it is not limited to this case. For example, the transparent conductive metal oxide includes indium tin oxide (ITO), but is not limited thereto. For example, the first electrode E1 can adopt a structure with three laminated sub-layers of ITO-Ag-ITO. In some embodiments, the second electrode E2 can be made of a metal with low work function, and can adopt at least one of magnesium and silver, but it is not limited to this case.

For example, the fourth insulating layer ISL4 and the fifth insulating layer ISL5 in FIG. 12C can correspond to the first planarization layer 121, and the sixth insulating layer ISL6. can be the second planarization layer 122. In some other embodiments, the fourth insulating layer ISL4 may not be provided, that is, the fifth insulating layer ISL5 can correspond to the first planarization layer 121. The first planarization layer 121 and the second planarization layer 122 can include a plurality of sub-layers, respectively.

For example, referring to the layout diagrams and the cross-sectional views of the embodiments of the present disclosure, the display substrate provided by at least one embodiment of the present disclosure can be manufactured by the following method.

(1) Forming a buffer layer BL and an isolation layer BR on a base substrate BS.

(2) Forming a semiconductor film on the isolation layer BR.

(3) Patterning the semiconductor film to form a semiconductor pattern layer.

(4) Forming a first insulating film on the semiconductor pattern layer.

(5) Forming a first conductive film on the first insulating film, and patterning the first conductive film to form a first conductive layer LY1.

(6) Doping the semiconductor pattern layer by using the first conductive layer LY1 as a mask, so as to form an active layer LY0.

(7) Forming a second insulating film on the first conductive layer LY1.

(8) Forming a second conductive film on the second insulating layer ISL2, and patterning the second conductive film to form a second conductive layer LY2.

(9) Forming a third insulating film on the second conductive layer LY2.

(10) Patterning at least one of the first insulating film, the second insulating film, and the third insulating film to form via holes and meanwhile forming the first insulating layer ISL1, the second insulating layer ISL2 and a third insulating layer ISL3.

(11) Forming a third conductive film, and patterning the third conductive film to form a third conductive layer LY3. The components in the third conductive layer LY3 are connected to the components located under the third conductive layer LY3 through the via holes.

(12) Forming a fourth insulating film and a fifth insulating film, and patterning the fourth insulating film and the fifth insulating film to form via holes and meanwhile forming a fourth insulating layer and a fifth insulating layer.

(13) Forming a fourth conductive film, and patterning the fourth conductive film to form a fourth conductive layer LY4.

(14) Forming at least one insulating layer (for example, see FIG. 12E, a sixth insulating layer ISL6) and forming at least one transparent conductive layer (for example, see FIG. 12E, a first transparent conductive layer LY01 and a second transparent conductive layer LY02). The transparent conductive layer includes a conductive line L1.

(15) Forming a first electrode E1 of a light-emitting element.

(16) Forming a pixel definition layer and a spacer PS.

(17) Forming a light-emitting functional layer.

(18) Forming a second electrode E2 of the light-emitting element.

(19) Forming an encapsulation layer.

Of course, in the display substrate provided by the embodiment of the present disclosure, the shield electrode SE may not be provided.

For example, in step (14), before forming the conductive line L1, processing the sixth insulating layer ISL6 to form a light-shielding portion; or, in the exposure process of forming the conductive line L1, using a negative photoresist.

In some embodiments, referring to FIG. 12D and FIG. 12E, the second planarization layer 122 includes a light-shielding portion 122b, and the orthographic projection of the connection electrode CE02 on the base substrate falls within the orthographic projection of the light-shielding portion 122b on the base substrate. In the structure of the display substrate shown in FIG. 12D and FIG. 12E, it is allowed to irradiate from the front surface of the base substrate (the upper surface of the base substrate shown in FIG. 12D and FIG. 12E) with the mask plate for forming the fourth conductive layer LY4 as a mask, so as to form the light-shielding portion 122b.

In some other embodiments, when the light-shielding portion is formed, if light is irradiated from the back surface of the base substrate (the lower surface of the base substrate shown in FIG. 12D and FIG. 12E), the parts of the second planarization layer 122 corresponding to the components in the first conductive layer LY1, the second conductive layer LY2 and the third conductive layer LY3 are also light-shielding portions.

Referring to FIG. 12D and FIG. 12E, the via hole V2 penetrates through the light-shielding portion 122b. FIG. 12D and FIG. 12E illustrate the case where the second planarization layer 122 includes the light-shielding portion 122b, by way of example. In some other embodiments, the second planarization layer 122 may not include the light-shielding portion 122b, and the second planarization layer 122 is light-transmissive everywhere. In this case, a negative photoresist is used when forming the conductive line L1.

In the embodiment of the present disclosure, the first conductive layer LY1 can be referred to as a first gate layer, the second conductive layer LY2 can be referred to as a second gate layer, the third conductive layer LY3 can be referred to as a first source-drain layer, and the fourth conductive layer LY4 can be referred to as a second source-drain layer.

At least one embodiment of the present disclosure provides a display device, which includes any one of the display substrates described above.

Figure 13A:
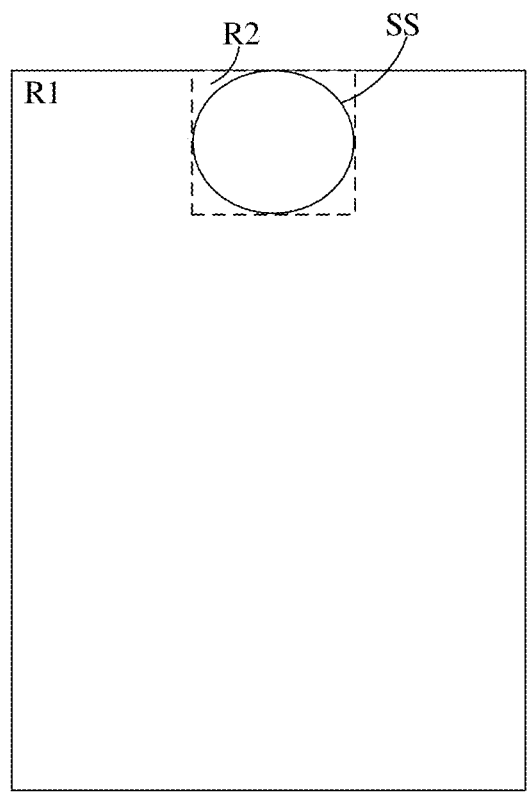
FIG. 13A and FIG. 13B are schematic diagrams of a display device provided by an embodiment of the present disclosure.
Figure 13B:
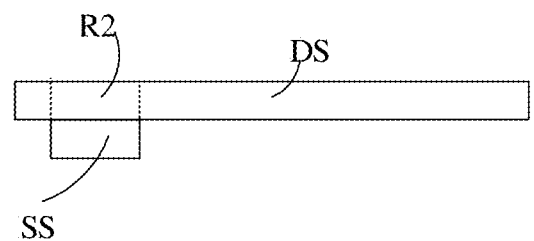

FIG. 13A and FIG. 13B are schematic diagrams of a display device provided by an embodiment of the present disclosure. As shown in FIG. 13A and FIG. 13B, a sensor SS is located at one side of a display substrate DS and located in a second display region R2. The ambient light propagates through the second display region R2 and can be sensed by the sensor SS. As shown in FIG. 13B, the side of the display substrate where the sensor SS is not provided is a display side, and images can be displayed on the display side. For example, the sensor includes a photosensitive sensor, and the photosensitive sensor is located at one side of the display substrate. In this kind of display device, hardware such as the photosensitive sensor (e.g., camera) can be disposed in the light-transmitting display region, which is beneficial to realize a true full screen because there is no need to drill holes.

For example, the second display region R2 can be rectangular, and the area of the orthographic projection of the sensor SS on the base substrate BS can be smaller than or equal to the area of the inscribed circle of the second display region R2. That is, the size of the region where the sensor SS is located can be smaller than or equal to the size of the inscribed circle of the second display region R2. For example, the size of the region where the sensor SS is located is equal to the size of the inscribed circle of the second display region R2, that is, the shape of the region where the sensor SS is located can be circular. Of course, in some embodiments, the second display region R2 can also have other shapes besides a rectangle, such as a circle or an ellipse.

For example, the display device is a full-screen display device with an under-screen camera. For example, the display device includes an OLED or includes a product including an OLED. For example, the display device includes any product or component which has a display function and includes the above-mentioned display substrate, such as a TV, a digital camera, a mobile phone, a watch, a tablet computer, a laptop computer, a navigator, and the like.

For example, the embodiments of the present disclosure are not limited to the specific pixel circuit shown in FIG. 12A, and other pixel circuits that can realize compensation for the driving transistor can be adopted. Based on the description and teachings of the implementations in the present disclosure, other setting manners that easily conceivable to those skilled in the art without creative work should fall within the protection scope of the present disclosure.

The above describes the case of 7T1C pixel circuit by way of example, and the embodiments of the present disclosure include but are not limited to this case. It should be noted that the embodiments of the present disclosure do not limit the number of the thin film transistor(s) and the number of the capacitor(s) included in the pixel circuit. For example, in some other embodiments, the pixel circuit of the display substrate can also be a structure including other numbers of transistor(s), such as a 7T2C structure, a 6T1C structure, a 6T2C structure, or a 9T2C structure, which is not limited in the embodiments of the present disclosure. Of course, the display substrate can also include pixel circuits with less than 7 transistors.

In the related art, the pixel circuit (including the first pixel circuit 10 and the second pixel circuit 20) and the first light-emitting element 30 have the same pitch. For example, generally, the width is about 30 microns (μm) to 32 μm, and the length is about 60 μm to 65 μm. However, in the embodiments of the present disclosure, in order to provide sufficient space for the arrangement of the second pixel circuits 20 without reducing the number of the pixels in the first display region R1, each pixel circuit can be compressed along the first direction X (e.g., the extending direction of the gate line, which can also be referred to as a horizontal direction), so that the width of the pixel circuit in the first direction is smaller than the width of the first light-emitting element 30; alternatively, the width of the first light-emitting element 30 in the first direction X can be greater than the width of the first pixel circuit 10 by enlarging the first light-emitting element 30 in the first direction X. In this way, given the same size of the base substrate BS, there can be a spare region in the first display region R1, and correspondingly, the second pixel circuit 20 for driving the second light-emitting element 40 located in the second display region R2 can be arranged in the spare region.

Figure 14:
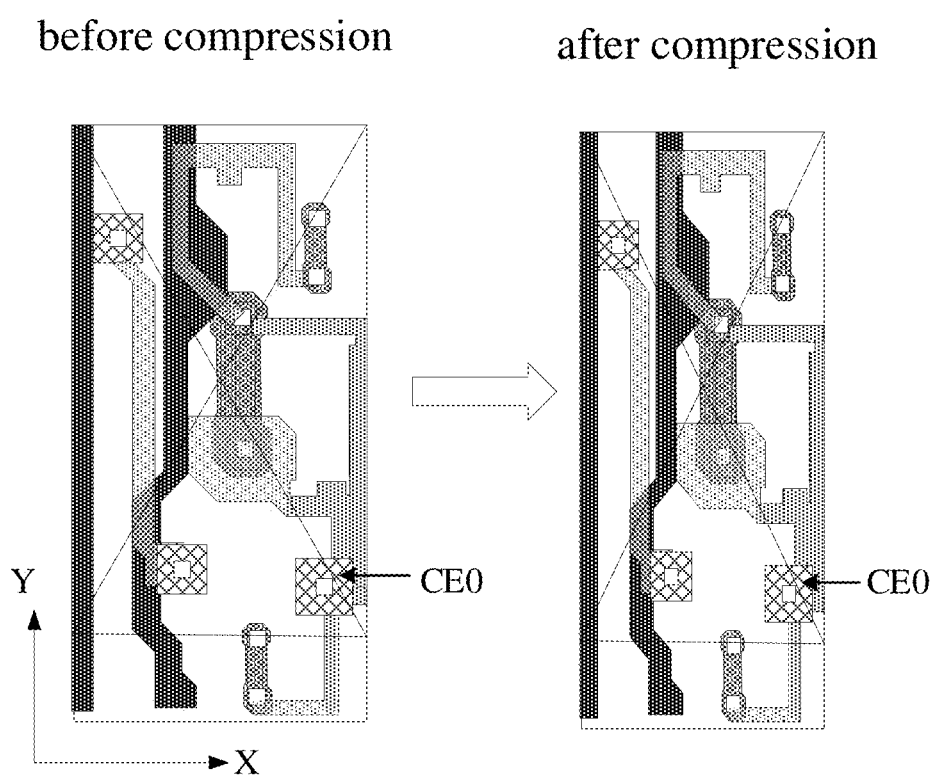
FIG. 14 illustrates structural layouts of a pixel circuit before and after compression.

For example, the width of each pixel circuit can differ from the width of the first light-emitting element 30 by about 4 μm. By way of example, in the case where the pixel circuit is compressed and the width difference is 4 μm, FIG. 14 shows the structural layouts of the pixel circuit before and after compression. Referring to FIG. 14, the pixel circuit can include a driving structure and a connection element CE0 to be connected to the first electrode (anode) of the light-emitting element, and the size of the connection element CE0 can represent the size of the pixel circuit. The dimensions of the pixel circuit and the light-emitting element before compression are both 1-100 μm in width and 2-100 μm in height. The dimension of the light-emitting element after compression can remain unchanged as compared with that before compression. For example, the size of the second light-emitting element 40 can be equal to or smaller than the size of the first light-emitting element 20. The height of the pixel circuit after compression remains unchanged, but the width thereof is narrowed by 1-20 μm. In this way, one or more extra columns of compressed pixel circuits are presented every few columns of compressed pixel circuits, as compared with the case before compression, and the whole screen adopts this design to realize full-screen compression. For example, these extra columns can be selected to be connected to the second light-emitting elements 40 in the second display region R2, so as to control the second light-emitting elements 40 to emit light. In some embodiments, the extra columns of pixel circuits close to the periphery of the second display region R2 are selected as the second pixel circuits 20 to be connected to the second light-emitting elements 40. In this way, normal display can be achieved without changing the resolution of the display substrate. That is, the existing space of the display substrate is fully utilized to realize normal display. The effect achieved by compressing the size of the pixel circuit is that, the number of the light-emitting elements (including the first light-emitting elements 30 and the second light-emitting elements 40) remains unchanged, thus there is no obvious difference in display effect as compared with the case before compression, that is, the display effect of the display substrate is good.

In the embodiments of the present disclosure, the elements located in the same layer can be formed by the same film layer through the same patterning process. For example, the elements located in the same layer can be located on the surface of a same element away from the base substrate.

For example, in the embodiments of the present disclosure, in the case where the orthographic projection of a component A on the base substrate falls within the orthographic projection of a component B on the base substrate, the orthographic projection of the component A on the base substrate is smaller than or equal to the orthographic projection of the component B on the base substrate, and the boundary of the orthographic projection of the component A does not exceed the boundary of the orthographic projection of the component B. For example, in the case where a component C is located directly above a component D, the orthographic projection of the component C on the base substrate falls within the orthographic projection of the component D on the base substrate. For example, the component A and the component B are different components, and the component C and the component D are different components.

It should be noted that, for clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and ink-jetting. The photolithography process refers to the process including film formation, exposure, development, etc., by using photoresist, mask plate, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily conceive of changes or substitutions within the technical scope disclosed in the present disclosure, and these changes or substitutions should be covered within the protection scope of the present disclosure. Therefore, the protection scope of the present disclosure should be subject to the protection scope of the claims.

What is claimed is:

1. A display substrate, comprising:
   a base substrate;
   a first conductive element, located on the base substrate;
   a first planarization layer, located on the first conductive element;
   a second conductive element, located on the first planarization layer and connected to the first conductive element through a first via hole penetrating through the first planarization layer;
   a second planarization layer, located on the second conductive element; and
   a conductive line, located on the second planarization layer,
   wherein the second conductive element is recessed at the first via hole, the second planarization layer has a light-shielding portion, and an orthographic projection of the first via hole on the base substrate falls within an orthographic projection of the light-shielding portion on the base substrate,
   wherein the second planarization layer further has a light-transmitting portion, and the orthographic projection of the first via hole on the base substrate has no overlap with an orthographic projection of the light-transmitting portion on the base substrate.

2. The display substrate according to claim 1, wherein the orthographic projection of the light-shielding portion on the base substrate overlaps with an orthographic projection of the second conductive element on the base substrate, or
   the orthographic projection of the light-shielding portion on the base substrate coincides with the orthographic projection of the second conductive element on the base substrate.

3. The display substrate according to claim 1, wherein the second conductive element has a recessed portion and a peripheral portion at an outer side of the recessed portion, the recessed portion has a bottom portion and a side portion, and the bottom portion is connected to the peripheral portion through the side portion.

4. The display substrate according to claim 1, wherein the second planarization layer comprises a photochromic material, the photochromic material is doped, as a doping material, in a base material of forming the second planarization layer.

5. The display substrate according to claim 4, wherein the photochromic material comprises a material which is black in itself and turns transparent after light irradiation, or
the photochromic material comprises a material which is transparent in itself and turns black after light irradiation.

6. The display substrate according to claim 5, wherein the material that is black in itself and turns transparent after light irradiation comprises heterocyclic nitrogen oxides or azo dyes, and
the material that is transparent in itself and turns black after light irradiation comprises silver halide.

7. The display substrate according to claim 4, wherein the photochromic material comprises a material which is black in itself and turns transparent after light irradiation, and an orthographic projection of the second conductive element on the base substrate falls within the orthographic projection of the light-shielding portion on the base substrate, or
the photochromic material comprises a material which is transparent in itself and turns black after light irradiation, and the orthographic projection of the first via hole on the base substrate coincides with the orthographic projection of the light-shielding portion on the base substrate.

8. The display substrate according to claim 1, further comprising a pixel unit, wherein the pixel unit comprises a pixel circuit and a light-emitting element, the pixel circuit is configured to drive the light-emitting element, the pixel unit comprises a first pixel unit and a second pixel unit, the display substrate comprises a first display region and a second display region, the pixel circuit and the light-emitting element of the first pixel unit are both located in the first display region, the pixel circuit of the second pixel unit is located in the first display region, the light-emitting element of the second pixel unit is located in the second display region, and the pixel circuit of the second pixel unit is connected to the light-emitting element of the second pixel unit through the conductive line.

9. The display substrate according to claim 8, wherein an orthographic projection of the pixel circuit of the first pixel unit on the base substrate at least partially overlaps with an orthographic projection of the light-emitting element of the first pixel unit on the base substrate, and an orthographic projection of the pixel circuit of the second pixel unit on the base substrate has no overlap with an orthographic projection of the light-emitting element of the second pixel unit, and/or
an orthographic projection of the conductive line on the base substrate partially overlaps with an orthographic projection of the pixel circuit of the first pixel unit on the base substrate.

10. The display substrate according to claim 8, wherein the pixel circuit comprises a driving transistor, and the driving transistor comprises a gate electrode;
the display substrate further comprises:
a first gate signal line, connected to the gate electrode of the driving transistor;
a constant voltage line, configured to provide a first constant voltage to the pixel circuit; and
a shield electrode, connected to the constant voltage line, wherein an orthographic projection of the first gate signal line on the base substrate falls within an orthographic projection of the shield electrode on the base substrate.

11. The display substrate according to claim 10, wherein the first conductive element comprises the constant voltage line, and the second conductive element comprises the shield electrode connected to the constant voltage line, and/or
the first conductive element and the constant voltage line are located in a same layer, and the second conductive element and the shield electrode are located in a same layer.

12. The display substrate according to claim 8, wherein the second conductive element is connected to the conductive line or the light-emitting element of the first pixel unit through a second via hole, and the second via hole penetrates through the light-shielding portion.

13. The display substrate according to claim 1, wherein a side surface of the light-transmitting portion is in contact with a side surface of the light-shielding portion.

14. A display device, comprising the display substrate according to claim 1.

15. The display device according to claim 14, further comprising a photosensitive sensor, wherein the photosensitive sensor is located at one side of the display substrate.

16. A display substrate, comprising:
a base substrate, comprising a first display region and a second display region;
a pixel unit, located on the base substrate, wherein the pixel unit comprises a pixel circuit and a light-emitting element, the pixel circuit is configured to drive the light-emitting element, the pixel unit comprises a first pixel unit and a second pixel unit, the pixel circuit and the light-emitting element of the first pixel unit are both located in the first display region, the pixel circuit of the second pixel unit is located in the first display region, the light-emitting element of the second pixel unit is located in the second display region, and the pixel circuit of the second pixel unit is connected to the light-emitting element of the second pixel unit through a conductive line;
a connection element, connected to the pixel circuit, and comprising a first connection element and a second connection element, wherein the pixel circuit of the first pixel unit is connected to the light-emitting element of the first pixel unit through the first connection element, the pixel circuit of the second pixel unit is connected to the conductive line through the second connection element, and the connection element comprises a first connection electrode and a second connection electrode;
a first planarization layer, located on the first connection electrode, wherein the second connection electrode is located on the first planarization layer and is connected to the first connection electrode through a first via hole penetrating through the first planarization layer; and
a second planarization layer, located on the second connection electrode, wherein the conductive line is located on the second planarization layer,
wherein the second connection electrode is recessed at the first via hole,
the second planarization layer has a light-shielding portion, and an orthographic projection of the first via hole on the base substrate falls within an orthographic projection of the light-shielding portion on the base substrate,
the second planarization layer further has a light-transmitting portion, and a side surface of the light-transmitting portion is in contact with a side surface of the light-shielding portion.

17. The display substrate according to claim 16, wherein the pixel circuit comprises a driving transistor, and the driving transistor comprises a gate electrode;

the display substrate further comprises:
- a first gate signal line, connected to the gate electrode of the driving transistor;
- a constant voltage line, configured to provide a first constant voltage to the pixel circuit; and
- a shield electrode, connected to the constant voltage line, wherein an orthographic projection of the first gate signal line on the base substrate falls within an orthographic projection of the shield electrode on the base substrate,
- wherein, the first planarization layer is located on the constant voltage line, the shield electrode is located on the first planarization layer, the second planarization layer is located on the shield electrode, and the shield electrode is connected to the constant voltage line through a via hole penetrating through the first planarization layer;
- the shield electrode is recessed at the via hole, and
- an orthographic projection of the via hole on the base substrate falls within the orthographic projection of the light-shielding portion on the base substrate.

18. The display substrate according to claim 17, wherein the second connection electrode is connected to the conductive line or the light-emitting element of the first pixel unit through a second via hole, and the second via hole penetrates through the light-shielding portion.

19. A manufacturing method of a display substrate, comprising:
- forming a first conductive element on a base substrate;
- forming a first planarization layer on the first conductive element;
- forming a second conductive element on the first planarization layer, wherein the second conductive element is connected to the first conductive element through a first via hole penetrating through the first planarization layer;
- forming a second planarization layer on the second conductive element; and
- forming a conductive line on the second planarization layer, wherein
- the second conductive element is recessed at the first via hole,
- the forming the second planarization layer comprises doping a photochromic material in a base material to form a planarization film, and performing a light irradiation treatment on the planarization film so that the second planarization layer has a light-shielding portion, and an orthographic projection of the first via hole on the base substrate falls within an orthographic projection of the light-shielding portion on the base substrate.

20. The manufacturing method according to claim 19, wherein the photochromic material comprises a material which is black in itself and turns transparent after light irradiation, and the light irradiation treatment is performed on an opposite side of the display substrate with respect to a side where the second planarization layer is disposed, or
- the photochromic material comprises a material which is transparent in itself and turns black after light irradiation, and the light irradiation treatment is performed on a side of the display substrate where the second planarization layer is disposed.

* * * * *